(12) United States Patent
Urban

(10) Patent No.: US 12,301,243 B2
(45) Date of Patent: May 13, 2025

(54) MACHINE LEARNING-ENABLED ANALOG-TO-DIGITAL CONVERTER

(71) Applicant: Magnolia Electronics Inc., Los Angeles, CA (US)

(72) Inventor: Luke Urban, Los Angeles, CA (US)

(73) Assignee: Magnolia Electronics Inc., Los Angeles, CA (US)

(*) Notice: Subject to any disclaimer, the term of this patent is extended or adjusted under 35 U.S.C. 154(b) by 46 days.

(21) Appl. No.: 18/238,430

(22) Filed: Aug. 25, 2023

(65) Prior Publication Data

US 2024/0162910 A1    May 16, 2024

Related U.S. Application Data

(60) Provisional application No. 63/425,965, filed on Nov. 16, 2022, provisional application No. 63/425,949, filed on Nov. 16, 2022.

(51) Int. Cl.
| | |
|---|---|
| H03M 1/06 | (2006.01) |
| H03M 1/10 | (2006.01) |
| G06F 3/041 | (2006.01) |
| G06F 3/045 | (2006.01) |

(52) U.S. Cl.
CPC .......... *H03M 1/0604* (2013.01); *H03M 1/10* (2013.01); *G06F 3/041* (2013.01); *G06F 3/045* (2013.01)

(58) Field of Classification Search
CPC ....... H03M 1/0604; H03M 1/10; G06F 3/041; G06F 3/045
See application file for complete search history.

(56) References Cited

U.S. PATENT DOCUMENTS

| | | |
|---|---|---|
| 9,112,524 B2 | 8/2015 | Snelgrove |
| 10,198,532 B2 | 2/2019 | Christian et al. |
| 10,970,441 B1 | 4/2021 | Zhang et al. |
| 11,101,810 B1 | 8/2021 | Veldhoven |

(Continued)

FOREIGN PATENT DOCUMENTS

| | | |
|---|---|---|
| EP | 3576020 A1 | 12/2019 |
| EP | 3944503 A1 | 1/2022 |
| KR | 20070094162 A | 9/2007 |

OTHER PUBLICATIONS

Feb. 28, 2024 International Search Report from International Application No. PCT/US2023/037257; 3 pgs.

(Continued)

*Primary Examiner* — Joseph J Lauture
(74) *Attorney, Agent, or Firm* — Patent Capital Group

(57) ABSTRACT

A method for calibrating a machine-learning unit includes generating an analog calibration signal from an input sequence; generating a digital calibration signal by taking digital samples representing the value of the analog calibration signal at a predetermined sample rate; and applying the analog calibration signal as an input to a physical parallel array analog-to-digital converter (PA ADC) to produce a digital response. The method further includes producing an output by the machine-learning unit, at least in part based on the digital response; modifying a parameter of the machine-learning unit to reduce an error between the output and the digital calibration signal; and determining that the error is not less than a predetermined threshold.

20 Claims, 11 Drawing Sheets

(56) References Cited

U.S. PATENT DOCUMENTS

| | | |
|---|---|---|
| 2009/0154575 A1 | 6/2009 | Rofougaran |
| 2010/0060502 A1 | 3/2010 | Toyama et al. |
| 2013/0207822 A1 | 8/2013 | Snelgrove |
| 2015/0245135 A1 | 8/2015 | Gao et al. |
| 2016/0182074 A1 | 6/2016 | Speir et al. |
| 2019/0028130 A1 | 1/2019 | Mansour et al. |
| 2019/0069787 A1 | 3/2019 | Lee et al. |
| 2019/0319633 A1 | 10/2019 | Zou et al. |
| 2019/0319634 A1 | 10/2019 | Zou et al. |
| 2022/0019883 A1 | 1/2022 | Veldhoven |
| 2024/0171189 A1 | 5/2024 | Urban |
| 2024/0284179 A1* | 8/2024 | Goudge .............. H04W 12/037 |

OTHER PUBLICATIONS

Mar. 11, 2024 International Search Report from International Application No. PCT/US2023/037263; 3 pgs.

Snelgrove, Martin, "Wideband Sampling by Decimation in Frequency," KAPIK Integration, Copyright Kapik Integration 2011; IMS2011 Baltimore, MD; 38 pages.

Dec. 30, 2024 USPTO Nonfinal Office Action from U.S. Appl. No. 18/238,421; 11 pages.

* cited by examiner

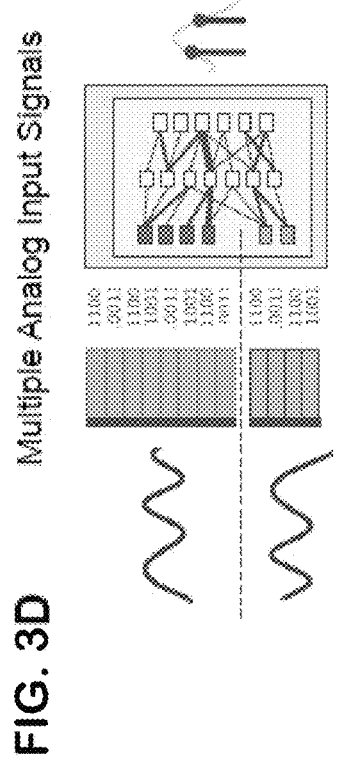
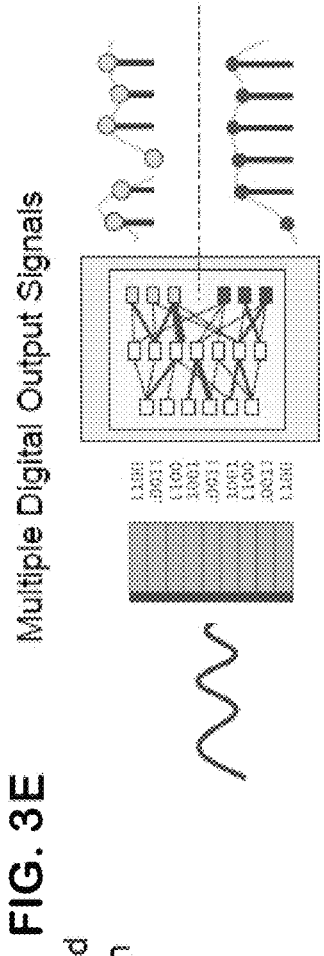
FIG. 3A Standard Shannon Nyquist
FIG. 3B Low Pass Filter
FIG. 3C Pattern Recognition
FIG. 3D Multiple Analog Input Signals
FIG. 3E Multiple Digital Output Signals

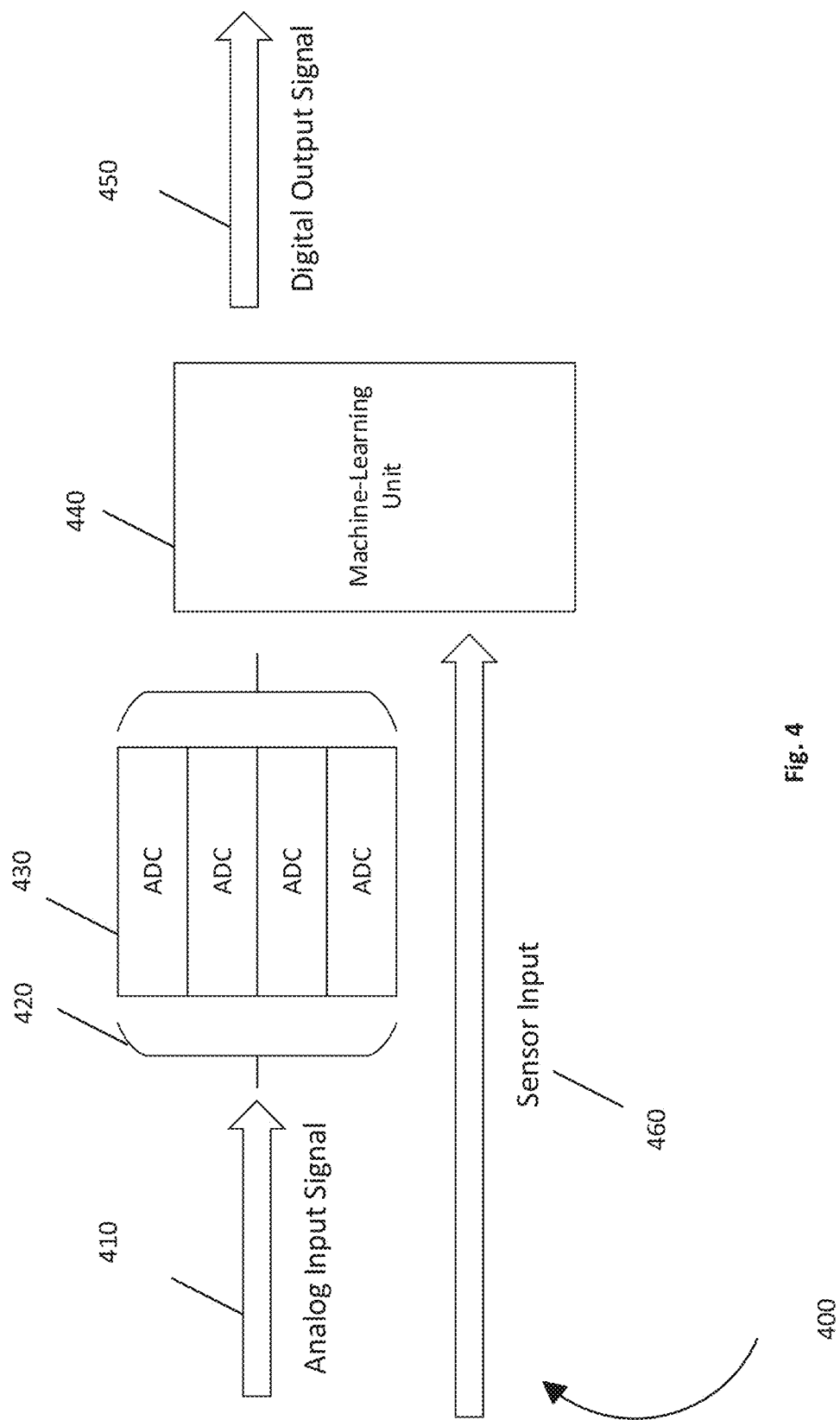

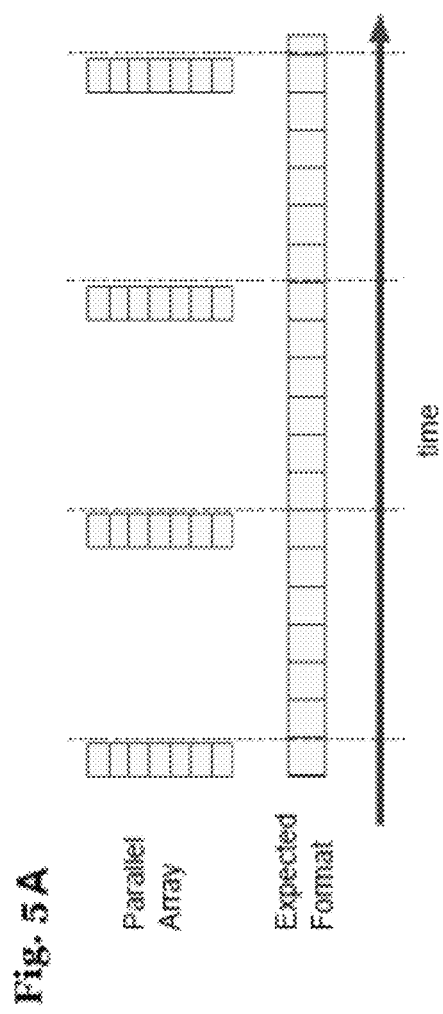
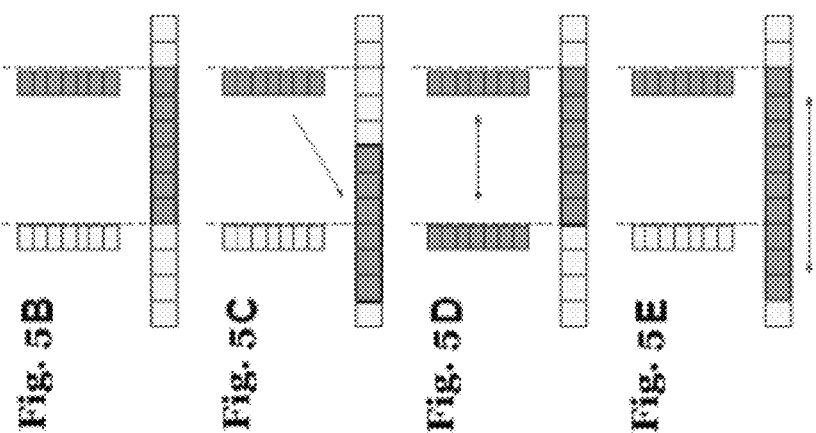
Fig. 5A
Fig. 5B
Fig. 5C
Fig. 5D
Fig. 5E

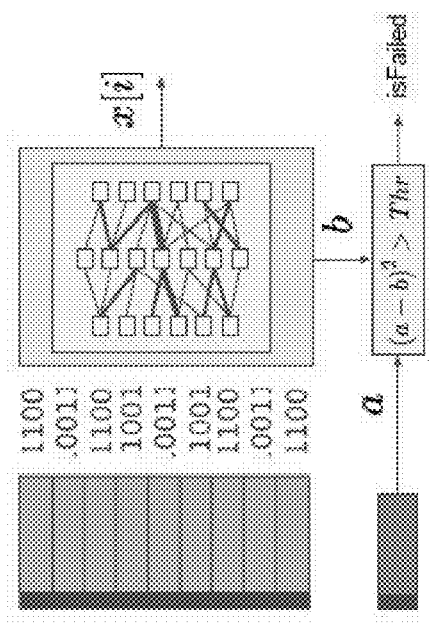
FIG. 7A Analytical Implementation
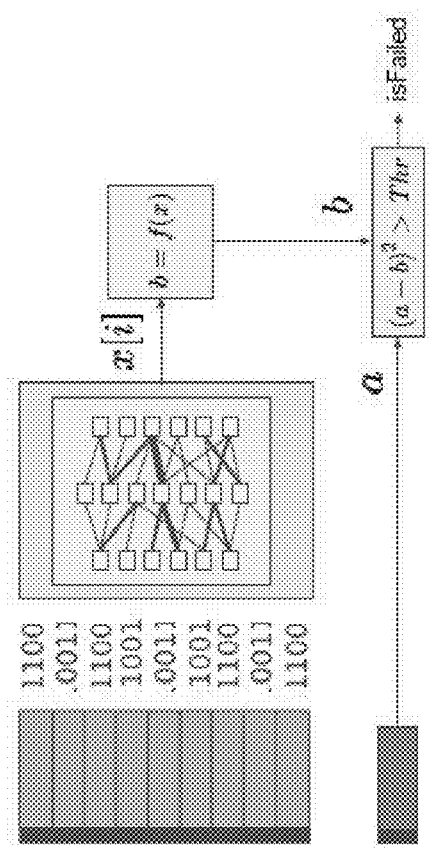
FIG. 7B Machine Learning Implementation

MACHINE LEARNING-ENABLED ANALOG-TO-DIGITAL CONVERTER

CROSS-REFERENCE TO RELATED APPLICATIONS

This application claims priority to U.S. Provisional App. Ser. No. 63/425,949, filed Nov. 16, 2022, entitled "Parallel Spectral Sampler," and U.S. Provisional App. Ser. No. 63/425,965, filed Nov. 16, 2022, entitled "Machine Learning Enabled ADC." This application is related to U.S. application Ser. No. 18/238,421, entitled "MACHINE LEARNING-ENABLED ANALOG-TO-DIGITAL CONVERTER," filed the same day as this application. The entire contents of all three applications are herein incorporated by reference in their entirety.

BACKGROUND

Technical Field

This disclosure relates to calibration and testing of analog-to-digital conversion and, in particular, to a sampling arrangement including machine learning.

Related Art

Analog-to-digital conversion is the backbone of modern electronics. At its core, an analog-to-digital converter (ADC) includes analog circuitry and digital comparators. The binary result of these comparators inform a user about an analog signal fed into the ADC device.

This analog-to-digital process occurs when a digital system interacts with the real world. The Shannon-Nyquist sampling theory states that all of the information contained in a frequency bounded analog signal can be captured through a discrete set of instantaneous measurements. The only requirement is that these instantaneous measurements are recorded at a fixed sampling rate that is at least twice as fast as the highest frequency contained in the analog signal. From this mathematical underpinning, a family of designs for ADCs have been developed. These systems include delicate circuitry designed to capture a sequence of instantaneous measurements of the analog input in the time domain. From this basic principle, each architecture has different trade offs with regards to key performance characteristics, such as power, speed, resolution, chip footprint area, and latency.

Researchers have experimented with alternative methods for solving the analog-to-digital conversion problem. For example, the field of sub-Nyquist sampling (such as compressed sensing) shows that if the input analog signal is known to contain consistent patterns, then the number of samples required to capture all information contained in the analog input is less than what Shannon-Nyquist requires.

Another approach attempts to solve the analog-to-digital conversion problem by applying a bank of mixer circuits to measure Walsh codes of the analog input.

However, these approaches often require idealized analog circuitry connected to a rigid digital interface to calibrate and reconstitute the original Shannon-Nyquist representation. This circuitry is often impractical, if not impossible, to build (such as ideal bandpass filters). As a result, these technologies have failed to be widely commercially adopted.

In the approaches described so far, the analog-to-digital conversion problem is solved by deriving a set of mathematical equations, and then designing and testing a set of circuitry to implement those equations. Any deviation from the ideal mathematics in the implemented circuitry must be studied and accounted for. As a result, every step along the process is well understood, and every component in the system is modeled and characterized.

Analog circuitry has complex and nonlinear behavior. Engineers can only build systems out of parts they understand, so the usage of analog circuits is constrained into domains simple enough to model. Thus, the equations that can be implemented are limited by the components the engineer understands. Furthermore, these systems can only be operated under conditions or environments that have been exhaustively modeled.

BRIEF SUMMARY

In a first implementation of the present disclosure, a method for calibrating a machine-learning unit includes generating an analog calibration signal from an input sequence; generating a digital calibration signal by taking digital samples representing the value of the analog calibration signal at a predetermined sample rate; applying the analog calibration signal as an input to a physical parallel array analog-to-digital converter (PA ADC) to produce a digital response; producing an output by the machine-learning unit, at least in part based on the digital response; modifying a parameter of the machine-learning unit to reduce an error between the output and the digital calibration signal; and determining that the error is not less than a predetermined threshold.

A second implementation is the first implementation, further comprising: scaling the analog calibration signal or the digital calibration signal to a predetermined voltage range and frequency bandwidth of the PA ADC.

A third implementation is any of the first or second implementations, further comprising: generating a sequence of random or pseudo-random numbers uniformly distributed across a range to produce the input sequence.

A fourth implementation is any of the first through third implementations, further comprising: generating a sequence of random or pseudo-random numbers distributed parametrically across a range to produce the input sequence.

A fifth implementation is any of the first through fourth implementations, further comprising: generating an analog signal by an electronic device or by a physical condition or process; and digitally sampling the analog signal to produce the input sequence, wherein the PA ADC is to observe the electronic device or the physical condition or process.

A sixth implementation is any of the first through fifth implementations, further comprising: seeding a generative network of a generative adversarial network with random numbers to create synthetic signals; training a discriminator network of the generative adversarial network with the synthetic signals and digital samples; producing a synthetic dataset by the generative adversarial network to resemble the digital samples; and drawing samples from the synthetic dataset to produce the input sequence, wherein the PA ADC is to observe an electronic device or a physical condition or process that generates samples substantially similar to the digital samples.

A seventh implementation is any of the first through sixth implementations, further comprising: multiplexing analog signals from a plurality of sources to produce the input sequence.

In an eighth implementation, an apparatus includes a signal generator that generates an analog calibration signal from an input sequence and that generates a digital calibration signal by taking digital samples representing the value of the analog calibration signal at a predetermined sample rate; a physical parallel array analog-to-digital converter (PA ADC) configured to receive the analog calibration signal as an input and to produce a digital response, at least in part based on the analog calibration signal; a machine-learning unit that receives the digital response and configured to produce an output, at least in part based on the digital response; and a processing unit configured to modify a parameter of the machine-learning unit to reduce an error between the output and the digital calibration signal and to determine that the error is not less than a predetermined threshold.

A ninth implementation is the eighth implementation, further comprising: a signal generator that scales the analog calibration signal or the digital calibration signal to a predetermined voltage range and frequency bandwidth of the PA ADC.

A tenth implementation is the eighth or ninth implementation, further comprising: a number generator that generates a sequence of random or pseudo-random numbers uniformly distributed across a range to produce the input sequence.

An eleventh implementation is any of the eighth through tenth implementations, further comprising: a number generator that generates a sequence of random or pseudo-random numbers distributed parametrically across a range to produce the input sequence.

A twelfth implementation is any of the eighth through eleventh implementations, further comprising: an electronic device or sensor that generates an analog signal; and a sampler that digitally samples the analog signal to produce the input sequence, wherein the PA ADC receives a signal from the electronic device or the sensor.

A thirteenth implementation is any of the eighth through twelfth implementations, further comprising: a generative adversarial network including a generative network and a discriminator network, the generative network seeded with random numbers to create synthetic signals, the discriminator network trained with the synthetic signals and digital samples, the generative adversarial network configured to produce a synthetic dataset to resemble the digital samples, wherein samples from the synthetic dataset are drawn to produce the input sequence, and the PA ADC receives a signal from an electronic device or a sensor that generates samples substantially similar to the digital samples.

A fourteenth implementation is any of the eighth through thirteenth implementations, further comprising: a multiplexer that multiplexes analog signals from a plurality of sources to produce the input sequence.

In a fifteenth implementation, a computer-readable medium includes instructions that, when executed by a processing unit, perform operations comprising: modifying a parameter of a machine-learning unit to reduce an error between an output and a digital calibration signal, wherein an analog calibration signal is generated from an input sequence, a digital calibration signal is generated by taking digital samples representing the value of the analog calibration signal at a predetermined sample rate, the analog calibration signal is applied as an input to a physical parallel array analog-to-digital converter (PA ADC) to produce a digital response, the machine-learning unit produces the output, at least in part based on the digital response; and determining that the error is not less than a predetermined threshold.

A sixteenth implementation is the fifteenth implementation, wherein the analog calibration signal or the digital calibration signal is scaled to a predetermined voltage range and frequency bandwidth of the PA ADC.

A seventeenth implementation is the fifteenth or sixteenth implementation, wherein a sequence of random or pseudo-random numbers uniformly distributed across a range is generated to produce the input sequence.

An eighteenth implementation is any of the fifteenth through sixteenth implementations, wherein a sequence of random or pseudo-random numbers distributed parametrically across a range is generated to produce the input sequence.

A nineteenth implementation is any of the fifteenth through eighteenth implementations, wherein an analog signal is generated by an electronic device or by a physical condition or process, the analog signal is digitally sampled to produce the input sequence, and the PA ADC is to observe the electronic device or the physical condition or process.

A twentieth implementation is any of the fifteenth through nineteenth implementations, wherein a generative network of a generative adversarial network is seeded with random numbers to create synthetic signals, a discriminator network of the generative adversarial network is trained with the synthetic signals and digital samples, a synthetic dataset is produced by the generative adversarial network to resemble the digital samples, samples from the synthetic dataset are drawn to produce the input sequence, and the PA ADC is to observe an electronic device or a physical condition or process that generates samples substantially similar to the digital samples.

A twenty-first implementation is any of the fifteenth through twentieth implementations, wherein analog signals from a plurality of sources are multiplexed to produce the input sequence.

In a twenty-second implementation, an apparatus includes signal-generation means for generating an analog calibration signal from an input sequence and for generating a digital calibration signal by taking digital samples representing the value of the analog calibration signal at a predetermined sample rate; conversion means for converting the analog calibration signal to produce a digital response; output-production means for receiving the digital response and for producing an output, at least in part based on the digital response; and modification means for modifying a parameter of the output-production means to reduce an error between the output and the digital calibration signal and for determining that the error is not less than a predetermined threshold.

A twenty-third implementation is the twenty-second implementation, further comprising: scaling means for scaling the analog calibration signal or the digital calibration signal to a predetermined voltage range and frequency bandwidth of the conversion means.

A twenty-fourth implementation is the twenty-second or twenty-third implementation, further comprising: number-generation means for generating a sequence of random or pseudo-random numbers uniformly distributed across a range to produce the input sequence.

A twenty-fifth implementation is any of the twenty-second through twenty-fourth implementations, further comprising: number-generation means for generating a sequence of random or pseudo-random numbers distributed parametrically across a range to produce the input sequence.

A twenty-sixth implementation is any of the twenty-second through twenty-fifth implementations, further comprising: analog-signal-generation means for generating an analog signal; and sampling means for digitally sampling the analog signal to produce the input sequence, wherein the conversion means receives a signal from the analog-signal-generation means.

A twenty-seventh implementation is any of the twenty-second through twenty-sixth implementations, further comprising: synthetic-dataset-production means for producing a synthetic dataset to resemble digital samples, the synthetic-dataset-production means seeded with random numbers to create synthetic signals and trained with the synthetic signals and the digital samples, wherein samples from the synthetic dataset are drawn to produce the input sequence; analog-signal-generation means for generating an analog signal; and sampling means for digitally sampling the analog signal to produce the input sequence, wherein the sampling means samples an output from the analog-signal-generation means to produce samples substantially similar to the digital samples, and the conversion means receives a signal from the analog-signal-generation means.

A twenty-eighth implementation is any of the twenty-second through twenty-sixth implementations, further comprising: multiplexing means for multiplexing analog signals from a plurality of sources to produce the input sequence.

In a twenty-ninth implementation, a method for calibrating a machine-learning unit includes generating an analog calibration signal from an input sequence; generating a digital calibration signal by taking digital samples representing the value of the analog calibration signal at a predetermined sample rate; applying the analog calibration signal as an input to a virtual parallel array analog-to-digital converter (PA ADC); simulating the virtual PA ADC in a circuit simulator or by a synthetic function or dataset to produce a digital response, at least in part based on the analog calibration signal; producing an output by the machine-learning unit, at least in part based on the digital response; modifying a parameter of the machine-learning unit to reduce an error between the output and the digital calibration signal; and determining that the error is not less than a predetermined threshold.

A thirtieth implementation is the twenty-ninth implementation, further comprising: scaling the analog calibration signal to a predetermined voltage range and frequency bandwidth of the PA ADC.

A thirty-first implementation is the twenty-ninth or thirtieth implementation, further comprising: generating a sequence of random or pseudo-random numbers uniformly distributed across a range to produce the input sequence.

A thirty-second implementation is any of the twenty-ninth through thirty-first implementations, further comprising: generating a sequence of random or pseudo-random numbers distributed parametrically across a range to produce the input sequence.

A thirty-third implementation is any of the twenty-ninth through thirty-second implementations, further comprising: generating an analog signal by an electronic device or by a physical condition or process; and digitally sampling the analog signal to produce the input sequence, wherein the PA ADC is to observe the electronic device or the physical condition or process.

A thirty-fourth implementation is any of the twenty-ninth through thirty-third implementations, further comprising: seeding a generative network of a generative adversarial network with random numbers to create synthetic signals; training a discriminator network of the generative adversarial network with the synthetic signals and digital samples; producing a synthetic dataset by the generative adversarial network to resemble the digital samples; and drawing samples from the synthetic dataset to produce the input sequence, wherein the PA ADC is to observe an electronic device or a physical condition or process that generates samples substantially similar to the digital samples.

A thirty-fifth implementation is any of the twenty-ninth through thirty-fourth implementations, further comprising: multiplexing analog signals from a plurality of sources to produce the input sequence.

In a thirty-sixth implementation, a computer-readable medium includes instructions that, when executed by a processing unit, perform operations comprising: simulating a virtual parallel array analog-to-digital converter (PA ADC) in a circuit simulator or by a synthetic function or dataset to produce a digital response, at least in part based on an analog calibration signal, wherein an analog calibration signal is generated from an input sequence, a digital calibration signal is generated by taking digital samples representing the value of the analog calibration signal at a predetermined sample rate, and the analog calibration signal is applied as an input to the PA ADC; producing an output by a machine-learning unit, at least in part based on the digital response; modifying a parameter of the machine-learning unit to reduce an error between the output and the digital calibration signal; and determining that the error is not less than a predetermined threshold.

A thirty-seventh implementation is the thirty-sixth implementation, wherein the analog calibration signal is scaled to a predetermined voltage range and frequency bandwidth of the PA ADC.

A thirty-eighth implementation is the thirty-sixth or thirty-seventh implementation, wherein a sequence of random or pseudo-random numbers uniformly distributed across a range is generated to produce the input sequence.

A thirty-ninth implementation is any of the thirty-sixth through thirty-eighth implementations, wherein a sequence of random or pseudo-random numbers distributed parametrically across a range is generated to produce the input sequence.

A fortieth implementation is any of the thirty-sixth through thirty-ninth implementations, wherein an analog signal is generated by an electronic device or by a physical condition or process, the analog signal is digitally sampled to produce the input sequence, and the PA ADC is to observe the electronic device or the physical condition or process.

A forty-first implementation is any of the thirty-sixth through fortieth implementations, wherein a generative network of a generative adversarial network is seeded with random numbers to create synthetic signals, a discriminator network of the generative adversarial network is trained with the synthetic signals and digital samples, a synthetic dataset is produced by the generative adversarial network to resemble the digital samples, samples from the synthetic dataset are drawn to produce the input sequence, and the PA ADC is to observe an electronic device or a physical condition or process that generates samples substantially similar to the digital samples.

A forty-second implementation is any of the thirty-sixth through forty-first implementations, wherein analog signals from a plurality of sources are multiplexed to produce the input sequence.

In a forty-third implementation, an apparatus includes a generation unit that generates an analog calibration signal from an input sequence and that generates a digital calibration signal by taking digital samples representing the value of the analog calibration signal at a predetermined sample rate; a virtual parallel array analog-to-digital converter (PA ADC) simulated in a circuit simulator or by a synthetic function or dataset to receive the analog calibration signal as an input and to produce a digital response, at least in part based on the analog calibration signal; a machine-learning unit that receives the digital response and configured to produce an output, at least in part based on the digital response; and a processing unit configured to modify a parameter of the machine-learning unit to reduce an error between the output and the digital calibration signal and to determine that the error is not less than a predetermined threshold.

A forty-fourth implementation is the forty-third implementation, further comprising: a scaling unit that scales the analog calibration signal to a predetermined voltage range and frequency bandwidth of the PA ADC.

A forty-fifth implementation is the forty-third or forty-fourth implementations, further comprising: a number generator that generates a sequence of random or pseudo-random numbers uniformly distributed across a range to produce the input sequence.

A forty-sixth implementation is any of the forty-third through forty-fifth implementations, further comprising: a number generator that generates a sequence of random or pseudo-random numbers distributed parametrically across a range to produce the input sequence.

A forty-seventh implementation is any of the forty-third through forty-sixth implementations, further comprising: an electronic device or sensor that generates an analog signal; and a sampler that digitally samples the analog signal to produce the input sequence, wherein the PA ADC receives a signal from the electronic device or the sensor.

A forty-eighth implementation is any of the forty-third through forty-seventh implementations, further comprising: a generative adversarial network including a generative network and a discriminator network, the generative network seeded with random numbers to create synthetic signals, the discriminator network trained with the synthetic signals and digital samples, the generative adversarial network configured to produce a synthetic dataset to resemble the digital samples, wherein samples from the synthetic dataset are drawn to produce the input sequence, and the PA ADC receives a signal from an electronic device or a sensor that generates samples substantially similar to the digital samples.

A forty-ninth implementation is any of the forty-third through forty-eighth implementations, further comprising: a multiplexer that multiplexes analog signals from a plurality of sources to produce the input sequence.

In a fiftieth implementation, an apparatus includes signal-generation means for generating an analog calibration signal from an input sequence and for generating a digital calibration signal by taking digital samples representing the value of the analog calibration signal at a predetermined sample rate; simulation means for simulating a virtual PA ADC to produce a digital response, at least in part based on the analog calibration signal; output-production means for receiving the digital response and for producing an output, at least in part based on the digital response; and modification means for modifying a parameter of the output-production means to reduce an error between the output and the digital calibration signal and for determining that the error is not less than a predetermined threshold.

A fifty-first implementation is the fiftieth implementation, further comprising: scaling means for scaling the analog calibration signal to a predetermined voltage range and frequency bandwidth of the simulation means.

A fifty-second implementation is the fiftieth or fifty-first implementation, further comprising: number-generation means for generating a sequence of random or pseudo-random numbers uniformly distributed across a range to produce the input sequence.

A fifty-third implementation is any of the fiftieth through fifty-second implementations, further comprising: number-generation means for generating a sequence of random or pseudo-random numbers distributed parametrically across a range to produce the input sequence.

A fifty-fourth implementation is any of the fiftieth through fifty-third implementations, further comprising: analog-signal-generation means for generating an analog signal; and sampling means for digitally sampling the analog signal to produce the input sequence, wherein the simulation means receives a signal from the analog-signal-generation means.

A fifty-fifth implementation is any of the fiftieth through fifty-fourth implementations, further comprising: synthetic-dataset-production means for producing a synthetic dataset to resemble digital samples, the synthetic-dataset-production means seeded with random numbers to create synthetic signals and trained with the synthetic signals and the digital samples, wherein samples from the synthetic dataset are drawn to produce the input sequence; analog-signal-generation means for generating an analog signal; and sampling means for digitally sampling the analog signal to produce the input sequence, wherein the sampling means samples an output from the analog-signal-generation means to produce samples substantially similar to the digital samples, and the simulation means converts a signal from the analog-signal-generation means.

A fifty-sixth implementation is any of the fiftieth through fifty-fifth implementations, further comprising: multiplexing means for multiplexing analog signals from a plurality of sources to produce the input sequence.

BRIEF DESCRIPTION OF THE SEVERAL VIEWS OF THE DRAWINGS

FIG. 3A shows the format of the analog input in Shannon-Nyquist sampling. FIG. 3B shows the same input signal, but with the digital format involving a low pass filter. FIG. 3C shows the same input signal but with feature extraction to identify the occurrence of a specific desired pattern. FIG. 3D shows a machine-learning-enabled device configured to accept multiple analog input signals. FIG. 3E shows a machine learning unit configured to produce multiple digital output signals.

FIG. 4 illustrates a layout for an example implementation including a sensor input, according to various implementations of the present disclosure.

FIG. 5A shows the alignment in time for the output of the parallel array during calibration, with the expected digital format of the calibration signal. FIG. 5B shows an example grouping in which a single parallel array measurement is paired with the sequence of the expected format occurring since the last measurement. FIG. 5C shows the sample point with the output being a time-shifted version of the expected format. FIG. 5D shows the sample point using two parallel array measurements as input. FIG. 5E shows the sample point with a single parallel array measurement and a wider sequence of the expected digital format.

FIG. 7A shows an analytical approach to test if the machine-learning-enabled ADC produces correct answers. FIG. 7B shows an implementation in which an output is an additional output of the machine-learning unit.

DETAILED DESCRIPTION

Figure 1:
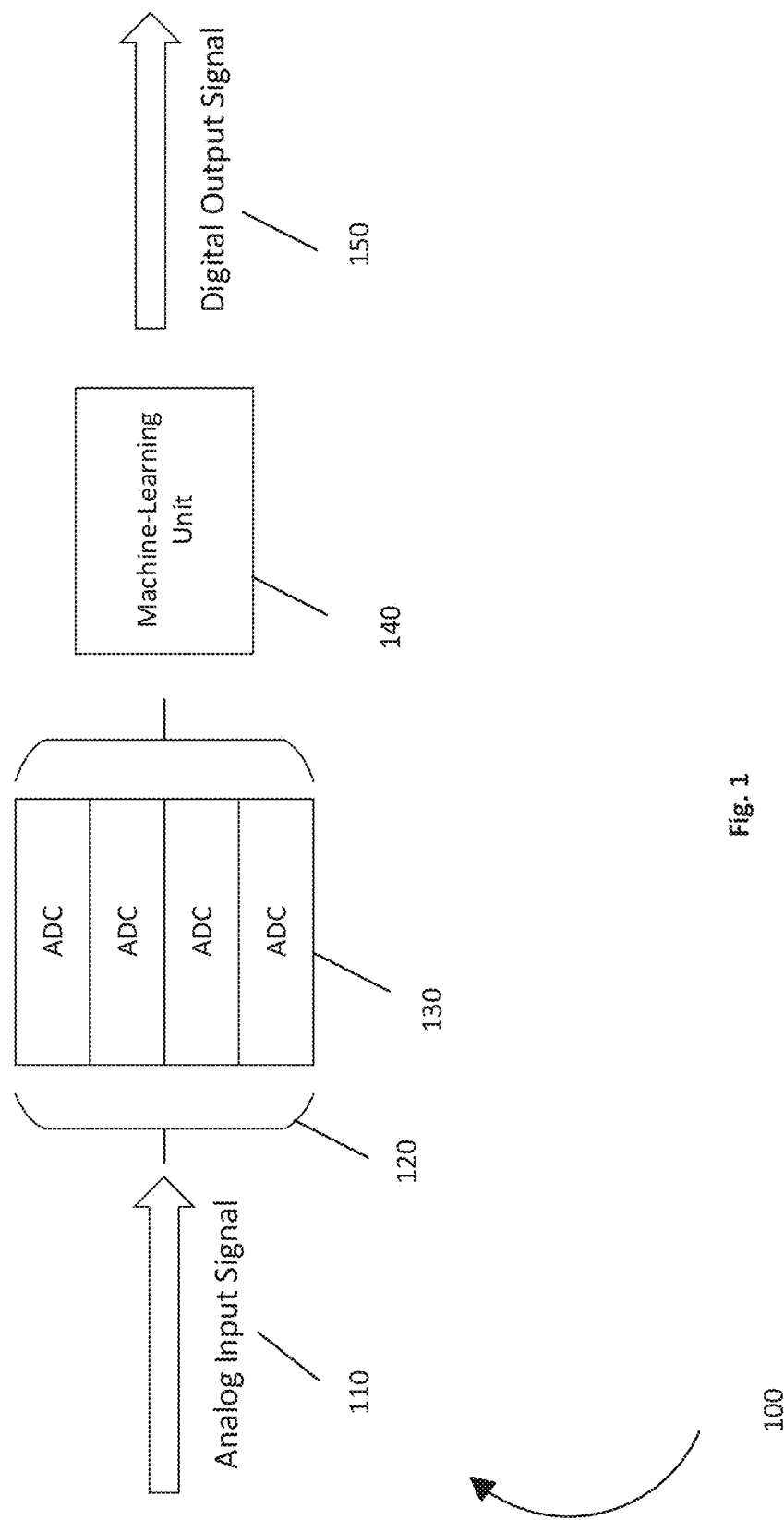
FIG. 1 illustrates a conceptual example of a machine-learning-enabled ADC 100, according to an implementation of the present disclosure.

FIG. 1 illustrates a conceptual example of a machine-learning-enabled ADC 100, according to an implementation of the present disclosure. The machine-learning-enabled ADC 100 receives an analog input signal 110 and outputs a digital output signal 150.

The machine-learning-enabled ADC 100 includes a signal routing unit (SRU) 120, a front-end parallel array of ADC circuits 130, and a machine-learning unit 140.

The SRU 120 receives the analog input signal 110 and can produce a plurality of output analog channels, each of the output analog channels based at least in part on the analog input signal 110. The SRU 120 can include a layered tree structure of buffer-and-split circuits (BSC). Each BSC can amplify the analog input to produce an output routed to a number of downstream elements. The number of layers and number of splits at each layer of the tree structure can be based on the resulting impedance and power consumption of the SRU 120. In one configuration, the tree is built with one layer. In this case, the single BSC can act as a buffer amplifier and routes its output to each analog signal in the plurality of outputs. In one example of a multilayer case, the output of each BSC branches out to the next layer in the tree, which terminates at the final layer as the analog signals in the plurality of outputs.

In another configuration, the signal bandwidth of each BSC can match the signal bandwidth of the analog input, such that each analog signal in the plurality of output channels is a replica of the analog input. In a configuration with bandpass filters, the signal bandwidth of each BSC can be restricted to split the analog input signal in a portion of its frequency spectrum. These bandpass BSCs are configured such that each analog signal in the plurality of channels contains the necessary information for its respective ADC circuit.

The parallel array of ADC circuits 130 receives the respective split outputs from the signal routing unit 120. Each of the ADC circuits 130 maps a respective split output to a digital output. In many implementations, the ADC circuits 130 are or include a comparator that compares the respective split output against a predetermined threshold. The number of such ADC circuits is a positive integer, N. The digital outputs form a collection of features in a high-dimensional format. The parallel array of ADC circuits 130 can be constructed from circuit elements, such as resistors, capacitors, and transistors, etc.

The machine-learning unit 140 receives the digital outputs from the ADC circuits 130. The machine-learning unit 140 recombines the collection of features and produces a digital output signal 150, which is a digital representation of the original analog input signal 110.

That is, the machine-learning unit 140 can convert the high-dimensional digital feature set into an equivalent of Shannon-Nyquist samples of the analog input signal. The resulting digital measurements from the machine-learning unit 140 then can be transmitted as the output of the overall machine-learning-enabled ADC 100.

In many implementations, the parallel array of ADC circuits 130 and the machine-learning unit 140 can be directly wired together. In other implementations, the unprocessed, raw output of the parallel array of ADC circuits 130 can be transmitted through an intermediary channel or path, and the machine-learning unit 140 is remote. This intermediary transmission can involve a data storage system, such that the machine-learning unit 140 processes the output of the parallel array asynchronously. The digital output of the machine-learning unit 140 then can be transmitted as the output of the overall ADC 100.

The present disclosure does not require there to be any structure or pattern inherent in the analog input signal. The machine learning algorithm does not rely on assumptions about the content of the signal to complement the data observed by the ADCs.

This characteristic differentiates the present disclosure from techniques that utilize Sub-Nyquist sampling, such as compressed sensing. Sub-Nyquist techniques assume that signals occupy only a subset of the signal bandwidth. In other words, they assume an input signal is sparse. This assumption of sparsity allows them to infer the true analog signal content using a sampling rate below that suggested by the Shannon-Nyquist theorem. For example, if it were known that a given signal is not carrying useful information at a certain set of frequencies, then those frequencies need not be measured to capture the useful information of the signal.

The practical utility of sub-Nyquist sampling is limited because not all signals meet that signal sparsity requirement. In addition, the effort involved in developing a circuit solution for a particular application is considerable. Further, any such solution is usually not transferable to other signals, even closely related ones.

However, certain domains of signals do have structure or patterns. For example, electrocardiograms have an inherent periodicity. Also, many packetized information exchange protocols have header or footer blocks that are sent before or after, respectively, the packet's payload, its useful information. If there is structure in a signal, then implementations of the circuit in the present disclosure can detect and exploit that structure to optimize device operation.

One could imagine an ADC device where a stream of data is fed in, and a machine-learning unit learns that there is a consistent pattern such that sufficient information about a signal can be observed merely by capturing P out of every Q samples per second, where Q is the number of samples per second indicated by the Shannon-Nyquist theorem, and P is some positive integer less than Q. To save power, the machine learning unit could take P samples, then power down itself, or power down the parallel array, or both, for a period of time.

Alternatively, the machine learning unit can listen for the start of a pattern, then shut down for a period of time related to that pattern. As another alternative, there might be a correlation between different frequency ranges in a signal, such that by sampling one range, the ADC device can power down the parts of the parallel array corresponding to the correlated frequency range, and infer their values from the sampled range.

Some implementations of the present disclosure do not assume any structure on the incoming analog signal. That is, the default assumption can be that there is no structure in the analog input.

In implementations of the present disclosure, the analog signal for calibration can be random and wideband within a designed voltage and frequency range.

This analog calibration signal can be created using a random number generator that produces an array of pseudo-random numbers following a uniform distribution between zero and one. Values from these numbers can then be offset and scaled to match the voltage range of an expected input signal. To convert this array of random numbers into a time series, a time-step is then defined based on the designed sample-rate of the ADC device. So, a 1 gigasample per second ADC can have a timestep of 1/(1 GHz)=1 ns, and a 100 megasample per second ADC can have a timestep of 1/(100 MHz)=10 ns. From there, the analog signal can be simulated numerically using sinc interpolation for converting a discrete-time signal into a continuous time signal. As an alternative, the analog signal can be created electronically using an arbitrary waveform generator or a digital-to-analog (DAC) device.

There may be cases where the input signal has some known structure (such as following a gaussian distribution, or following 1/f noise). In these cases, the calibration process can be customized, such as by using pseudo-random numbers from a normal distribution (not a uniform distribution), etc. Specific noise sources might be expected, such as powerline noise from the electrical grid (60 Hz USA, 50 Hz Europe). This noise can be incorporated by adding a sine-wave of the particular frequency at random amplitudes, offsets, and phases.

A signal, such as I/Q data that includes amplitude-modulating two 90-degree-out-of-phase sine waves and summing the result, might be expected. In this case, the amplitude modulation can be randomized using a random number generator (RNG), and the results multiplied by the sine-waves at a predetermined frequency.

Machine Learning Unit

The machine learning unit includes circuitry that maps digital features generated by the parallel array into a digital representation of the analog input signal.

$$<Y_1, Y_2, \ldots, Y_M>=f(X_1, X_2, \ldots, X_n).$$

This mapping is defined by a set of parameters that are specific to an implementation of the machine-learning unit, such as the weights in a neural network. The exact mathematical nature of the mapping between the input and the output is determined through a calibration procedure. In the calibration procedure, the machine-learning unit is provided with example digital inputs and their desired digital outputs. During calibration, the parameters are adjusted through optimization techniques, such as backpropagation and stochastic gradient descent (SGD), until the machine-learning unit produces the desired output within an acceptable tolerance. This calibration procedure can occur before manufacturing, using numerical simulation, and/or after manufacturing, on test devices. In some implementations, active learning, which is a slow and power intensive process, occurs on the device. In other implementations, after a successful calibration, the parameters can be hard coded (which can be updated through firmware) or hardwired (which is permanent), and the machine-learning unit can process data from the parallel array in inference mode, without any further learning.

The machine-learning unit can be implemented 1) in software, 2) using a field programmable gate array (FPGA), or 3) implemented as an application specific integrated circuit (ASIC). The choice in implementation depends on a tradeoff between flexibility and performance, with software typically having the most flexibility and an ASIC typically having the best performance.

Machine Learning Unit—Feedforward Neural Network

Figure 2A:
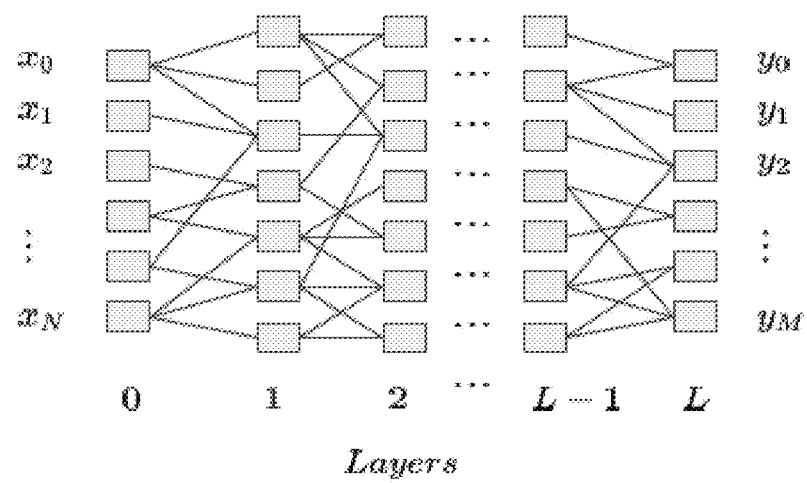
FIG. 2A illustrates an implementation of the machine-learning unit as a neural network, according to an implementation of the present disclosure.
Figure 2B:
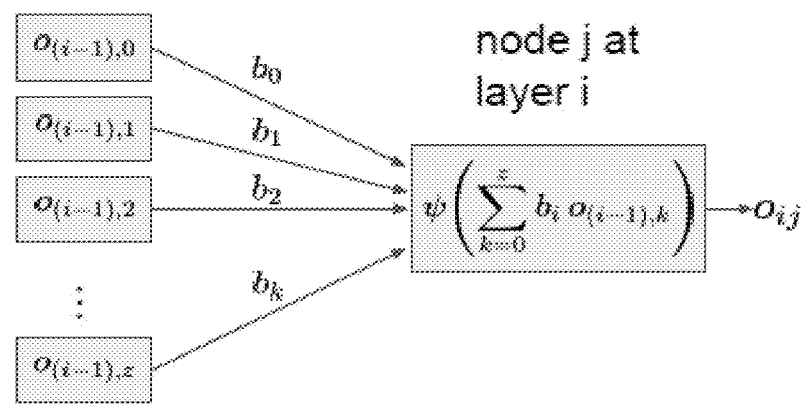
FIG. 2B shows the output of a specific node at a specific layer, according to an implementation of the present disclosure.

FIG. 2A illustrates an implementation of the machine-learning unit as a neural network, according to an implementation of the present disclosure. The input feature set (x) is fed into the network, which includes multiple layers of nodes that form weighted connections between each other in the subsequent layers. This finally results in the output, (y). FIG. 2B shows how the output of a specific node at a specific layer is the result of an activation function, φ, applied to a weighted sum of the output of the nodes in the previous layer.

This approach involves a collection of nodes that form weighted connections with each other, arranged in sequential layers. The input layer of the network is connected to the digital features generated by the parallel array. As shown in FIG. 2B, the output of each node ($o_j$) in the input layer combines the digital features using a weighted sum. The node then applies an activation function (φ), such as rectified linear unit, hyperbolic tangent, or sigmoid, to the resulting sum.

$$o_j = \varphi\left(\sum_{k=1}^{n} w_{kj} \cdot x_k\right).$$

The exact weighting at each node is calculated during the calibration procedure, and the activation function can be selected based on various criteria. The output of this first layer is then connected in the same manner to a hidden layer, and the process is repeated. The number of hidden layers and the number of nodes in each layer can be based on various criteria. At the final stage, the final hidden layer is connected to the output of the neural network. The output layer applies the same weighted sum and activation process, and the output of each final node is a digital number that represents a sample of the original analog signal. The values from this output layer are then routed out of the device as the overall output of the machine-learning-enabled ADC.

Machine Learning Unit—Recurrent Neural Network

In standard neural network design, the nodes in the network form a set of sequential layers. As a result, there are no loops in the system, such that the output of one node is never fed backwards to a lower layer. There is a class of neural networks that do allow these loops to occur, called recurrent neural networks (RNN). These networks apply similar techniques as the standard neural networks for optimizing and processing data. The key advantage is that recurrent loops allow the network to maintain a form of memory, which can affect future results. One could think of a standard neural network as applying a finite response filter (FIR) and the recurrent neural network as applying an infinite response filter (IIR). Thus, select implementations include an RNN when applying a filter to the expected digital output or when using a collection of non-time-invariant elements in the parallel array.

A large dataset of examples can be used to train a machine-learning model. These examples can include an input value (e.g., what is fed into the neural network) and an output value (e.g., what is fed out of the neural network). In select implementations of the present disclosure, the input value is the response of the parallel array to the analog calibration signal. There are at least two ways to measure the response of the parallel array to the analog calibration signal: computationally and electronically.

Computationally, software packages can simulate the performance of the parallel array at various conceptual levels (e.g., system level, circuit level, layout level). At the system level, high-level components are assumed and modeled (such as ideal bandpass filters and ideal ADC products) through the MATLAB signal-processing toolbox and SciPy libraries. One step lower, a circuit diagram including ideal resistors, capacitors, and transistors, can be modeled and simulated using mixed-signal circuit simulators (e.g., SPICE, Verilog-A, VHDL-AMS). One step lower, an integrated circuit layout can be simulated using custom models of circuit components specific to a particular manufacturing technique using process-development kits (PDK) specific to an individual semiconductor foundry. At each level, the circuit performance is simulated using the analog calibration signals described above, and the digital output of the parallel array circuit is recorded as the 'example input' to the neural network.

Electronically, a test device can be manufactured using the same circuit layout and manufacturing technique as a final product. Due to the cost and complexity of manufacturing a device, this process occurs after computational simulation. This dummy device includes only the parallel array. Thus, a physical instance can be used to observe the deviation from the design introduced by the manufacturing process, even if that deviation is not reflected in the process-development kit provided by the foundry. This test device is connected to an arbitrary waveform generator that produces electronic versions of the analog calibration signals. The results from the parallel array are then recorded and stored as the 'example input' for calibration of the neural network. Further, at each stage of modeling (e.g., system, circuit, layout, or test device), the example measurements can be isolated, such that array performance at the system level is not mixed with array performance at the layout level, etc.

A particular device has performance characteristics for a given environmental condition, such as an operating temperature range (0 C to 60 C, or −55 C to 175 C, etc). To ensure performance in these ranges, a device for oC to 60 C operating temperature should calibrate across that range, and the −55 C to 175 C should calibrate across a wider range. This calibration is done either by including environmental variables into computational simulations or placing the test device in a simulated environment (such as an oven or freezer).

Each machine-learning-enabled ADC device has a bit resolution and conversion error rate (CER). Using that information, a threshold can be defined to test if a specific neural network has converged to an appropriate input-output solution. If the errors on a test set fall below that threshold, the model is a success, and training can be stopped.

If a machine-learning model converges for a specific design, then the design is a success. If the machine-learning model fails to converge, then the design should be adjusted. This adjustment can involve adjusting the layout of the design to improve noise performance, tuning the parameters of specific components (R and C values, etc), adding more circuit elements, changing the manufacturing technique, and/or creating a new circuit design, until the neural network can pass convergence.

Additionally, the integrated circuit can be enhanced with principal component analysis, autoencoding, neural dropout analysis, etc. These techniques advantageously might suggest that certain elements in an integrated circuit design can be removed or reallocated.

The ability of machine learning to interpret complex data formats allows for the machine-learning-enabled ADC system to include parts that are easy to manufacture, but have complex or nonlinear characteristics. The standard digital format (Shannon-Nyquist sampling) output by the machine-learning unit is a sequence of instantaneous values of the analog signal taken at a fixed rate, acquired at least twice as fast as the highest frequency contained in the original analog input. The machine-learning-enabled ADC can also generate a customized digital format by applying specific filters or feature extractions to the analog input signal. The machine-learning-enabled ADC can accept multiple analog input signals and/or generate multiple digital output signals. The output of the machine-learning unit, in the desired format, is then provided as output for the overall system and can be processed downstream. The ADC device also can include a range of sensors to monitor the environment and behavior of the device, which are fed as additional input into the machine-learning unit. The ADC device also can incorporate onboard calibration and/or real-time dimensionality reduction units to optimize the performance of the ADC device after manufacturing.

In general, a machine-learning-enabled ADC includes a parallel array of analog-to-digital circuits and a machine-learning unit. The parallel array can be constructed from circuit elements, like resistors, capacitors, and/or transistors. The machine-learning unit can be constructed from circuit elements or implemented in software. The parallel array accepts an analog signal as input and produces a high-dimensional digital signal in response.

The output of the parallel array can be directly wired to the machine-learning unit or transmitted through an intermediary. The connection between the parallel array and machine-learning unit can involve storage units, resulting in asynchronous processing of the parallel array. The digital output of the machine-learning unit is then transmitted as the output of the overall ADC device.

The ADC device can receive high-dimensional input signals and generate high-dimensional output signals.

The use of machine-learning enhances the machine-learning unit's ability to handle signals containing particular patterns or characteristics.

Because the machine-learning unit can adjust, the ADC device can tolerate the failure or impairment of one or more subsampling elements.

The parameters of the machine-learning unit can be adjusted to perform better on a given set of test cases, sometimes called a test bench. For example, the machine-learning unit in devices targeted to a particular jurisdiction can be configured to resist harmful electromagnetic interference tested by that jurisdiction's regulator, or detect signals specific to that jurisdiction's environment. In other words, the machine learning parameters can be used to tune the device to adapt a product to a given commonly-regulated market.

Traditional ADC approaches require rigid analytical designs, where the results of each digital comparator are fully understood and modeled by the engineer. Our approach breaks from this design philosophy, and applies machine learning instead. In various implementations of the present disclosure, the mapping between each digital comparator and the resulting digital measurement is not necessarily known. Instead, the mapping is inferred through observation by the machine-learning unit.

The machine-learning unit allows for the parallel array to be built of parts that are easy to manufacture, but have complex or nonlinear characteristics. On top of the complex behavior of analog circuitry, a physical device produced through manufacturing will never exactly match the idealized circuits designed by engineers, and these differences become apparent when the device is pushed to the extremes (via speed, power, node size, environment). As a result, engineers design conservatively, ensuring their devices typically are not pushed outside of a safe operating regime.

Instead of having a perfect analytical model of the analog circuitry, the machine-learning unit can learn the behavior of the manufactured device. As a result, the manufactured ADC device can be pushed outside of its "safe" operating regime, and engineers can make more flexible and radical design choices.

Prior to deployment, the machine-learning unit of the device typically is calibrated. This process can be based on the particular machine-learning algorithm implemented by the machine-learning unit, but in general occurs in two phases: data collection and optimization. During data collection, an analog input signal is fed into the parallel array, and the resulting digital features are recorded along with their expected (i.e., calculated externally) digital representation. In the optimization phase, the parameters of the machine-learning unit are adjusted until the recorded features from the parallel array can be successfully mapped by the machine-learning unit to their expected digital output within some threshold. This two stage calibration process can occur prior to manufacturing, through simulation, and/or on test devices. The resulting machine-learning model then can be uploaded to the machine-learning-enabled ADC.

In many implementations, the analog input signals in the calibration procedure are random and wideband with a predetermined frequency range. These calibration signals can be based on the results of a random number generator. Specifically, a random sequence of digital numbers is created, and an analog format of the calibration signal can then be generated therefrom, either numerically in software or electronically using a digital-to-analog converter (DAC). The random sequence of digital numbers are then stored as the expected digital representation of the analog calibration signal.

In select implementations, the analog input signal can be oversampled, such that the samples occur faster than the Shannon-Nyquist frequency. This oversampling can be performed using upsampling techniques on the expected digital representation of the calibration signal, by interpolating between each sample point according to the oversampling rate.

In some cases, it might be known ahead of deployment that the deployed device might be exposed primarily to analog input signals that have a dominant, consistent structure or well-defined pattern. In some implementations, the device can be calibrated to produce more accurate or precise readings of signals possessing that structure or pattern. For example, electrocardiograms have a regular pattern of three parts that occur in sequence: the P-wave, the QRS complex, and the T-wave. Deviations from this sequence, or in the relative amplitudes or durations of the parts, or the presence of certain other signal complexities during or between the parts, can carry important implications of the functioning of the heart. A device according to the present disclosure, deployed in this context, might benefit from domain-specific precision. For example, the ability of a machine-learning enabled ADC to produce highly precise digital output code in response to atypical input analog values at, for example, the Q trough or the R peak, can aid the diagnosis of particular conditions.

More generally, a device deployed in a particular application domain might encounter signals constrained in some way as to frequency, period, or amplitude. In calibrating devices for applications with constrained signals, the error in observing signals the machine-learning enabled ADC is expected to encounter can be reduced, at the expense of a worse error in observing signals the ADC is not expected to encounter. In these cases, the calibration signals can be created to reflect the constraints of the expected analog input signals. Instead of generating the calibration signals from a uniform random number generator, the calibration signal can be a parametric model or example recordings. In such a case, the result of the parametric model or example recordings can be saved as the expected digital representation of the analog calibration signal.

FIGS. 3A-C show example digital formats of the analog input signal. For example, FIG. 3A shows the format (dots) of the analog input (line) in Shannon-Nyquist sampling. FIG. 3B shows the same input signal, but with the digital format involving a low pass filter. FIG. 3C shows the same input signal but with feature extraction to identify the occurrence of a specific desired pattern.

The machine-learning-enabled ADC can be calibrated to perform digital signal processing and/or feature extraction. Examples include applying specific notch filters to the input, customized finite impulse response (FIR) filters, and/or identifying when a specific pattern has occurred. This effect can be implemented at the data generation stage. Specifically, when calibrating the machine learning unit to perform filtering and feature extraction, the signal processing can be applied to the expected digital representation only. Thus, the analog calibration signal is unchanged. Most digital filters produce distorted output, called an edge effect, at the beginning and the end of a section of filter data. These distortions can be omitted by cutting out the beginning and end of the calibration signal. The amount of data to cut off of the calibration signal depends on the properties of the desired filter.

Some applications, such as receiving signals across multiple antennas, use multiple input channels arising from multiple analog input signals. In this case, each analog input signal can be fed into its own parallel array, and the resulting digital feature sets are combined and fed into the machine-learning unit. FIG. 3D shows a machine-learning-enabled device configured to accept multiple analog input signals.

Additionally or alternatively, the desired digital output format can contain multiple digital signals, as shown in FIG. 3E. FIG. 3E shows a machine learning unit configured to produce multiple digital output signals. For example, the analog input signal can contain two multiplex signals, each as specific frequency bands. The machine-learning unit can then be calibrated to split the content of the analog input into two digital streams, and output each of the desired streams of data, simultaneously. In the case of a neural network, this output results in the output layer of the network having specific nodes devoted to each signal.

The performance of the parallel array during the calibration signal can initially be simulated in software. Mixed-signal circuit simulators can simulate the performance of the parallel array in the time-domain. The present inventor has observed that only a few gigabytes of simulated data are sufficient to optimize the model, but larger datasets can improve the overall performance. In some cases, the result is a high-dimensional digital signal, representing the output of each element in the parallel array, aligned in time with the expected digital representation of the calibration signal.

There may be cases where one design is deployed into several specific environments. For example, one device is to be operated in a high-pressure environment, and another separate device (based on the same design and manufacturing) is to be operated in a low-temperature environment. In this case, each environmental condition can be modeled during the data collection phase. This modeling results in multiple data sets collected from the same test device, each paired to a specific environmental condition. These data sets can be treated separately to optimize the future devices for their specific environments, or they can be pooled together to form a resilient calibration of a device. If an individually deployed device is to operate in a range of environmental conditions, then the data collection can be performed across the expected conditions. This data can then be pooled together blindly, without labeling which environment each sample derived from.

The result of the data collection phase is a stream of data generated by the simulated or tested parallel array, aligned in time with the expected digital representation of the signal. These two streams of data can be sliced into sample points.

FIG. 5A shows the alignment in time for the output of the parallel array (vertical bar) during calibration, with the expected digital format of the calibration signal.

Each sample point represents a measurement from the parallel array (e.g., the input) paired with a segment of the expected digital representation (e.g., the output). Once the data stream is sliced into sample points, the sample points are shuffled such that the temporal alignment between two samples is lost. This shuffling can prevent the system from overfitting to potential sequential patterns in the signals. Each sample point thus is independent and can contain sufficient information to map from the input to the output.

FIG. 5B shows an example grouping of the data from the parallel array and the expected digital format. As discussed above, this grouping splits the data stream into sample points that are fed into the machine-learning model. In this case, a single parallel array measurement is paired with the sequence of the expected format occurring since the last measurement.

FIG. 5C shows the sample point with the output being a time-shifted version of the expected format.

FIG. 5D shows the sample point using two parallel array measurements as input.

FIG. 5E shows the sample point with a single parallel array measurement and a wider sequence of the expected digital format.

One method to slice the streams of data is based on updates in the parallel array. In this case, each sample point represents the new value of the parallel array (e.g., the input) and the stream of expected values that occurred since the previous update (e.g., the output). The window of expected values can be shifted forward and backward in time, such that the segment of expected values does not perfectly match the time between parallel array updates. The window of the expected values can also be widened beyond values between two array updates. The input portion of the sample point can also be adjusted. Previous measurements of the parallel array can be grouped together to capture ongoing patterns in the array. The machine-learning unit can include a data buffer for previous measurements. The number of previous measurements, the timing offset of the expected values, and the number of expected values can be determined advantageously.

Once the data streams have been converted into a database of sample points, the machine-learning unit can be trained. The initial parameters of the machine-learning model can be randomized. A collection of the sample points can be grouped together as the training set. For each sample point in the training set, the input data can be fed into the machine-learning model, and the results of the model can be compared against the expected output of the sample point using a loss function, such as mean-squared error, mean absolute error, or log-loss. This function can calculate how far off the current model is from the correct answer. After the machine-learning algorithm iterates over the entire training set, the internal parameters of the model can be adjusted, based on the resulting errors. The identity of the parameters (e.g., weights, biases) and operations for adjusting the parameters are specific to the machine-learning algorithm. The training process is then repeated with the adjusted model. Once the training has converged to a predetermined precision on the training set or a maximum iteration steps have been achieved, the trained model can be tested for convergence. If the model fails the test, the training step can be repeated with a new set of training data until the model passes the test. In various implementations, the new training can begin with the parameters from the previous training stage, or the machine learning model can be re-randomized.

A backpropagation algorithm can be applied to artificial neural networks to adjust the parameters of the network (e.g., the weights between neurons) by calculating the gradient of the loss function for a given sample with respect to each weight in the model. This algorithm uses the computationally efficient method of calculating these gradients using the chain rule in calculus. In general, via the chain rule, the partial derivative of the error with respect to a given weight is equal to the partial derivative of the error with respect to the output of that neuron, multiplied by the partial derivative of the output of that neuron with respect to the net input to that neuron, multiplied by the partial derivative of the net input of that neuron by the desired weight.

$$\frac{\delta E}{\delta w_{ij}} = \frac{\delta E}{\delta o_j} \cdot \frac{\delta o_j}{\delta net_j} \cdot \frac{\delta net_j}{\delta w_{ij}}.$$

Dynamic programming techniques, such as those implemented in the TensorFlow software, can save the outputs of one calculation to speed up the gradient calculation of another parameter in the network. These gradients show how small changes in each parameter affect the overall error of the network. If the gradient is positive, then decreasing the parameter can improve performance, and if the gradient is negative, then increasing the parameter can improve performance. The bigger the magnitude of the gradient is, the larger the effect changing that parameter will have on the network performance.

Determining when the machine-learning model has been sufficiently trained can occur using a randomized set of sample points that differ from the training set. The machine-learning model can receive the test points, and the raw model performance can be subtracted from the expected results.

$$E = Y_{test} - f(X_{test}).$$

Since the output of each sample point, $Y_{test}$, is an array of digital values, this loss function is a high dimensional vector.

$$E[i] = Y_{test}[i] - f(X_{test}[i]).$$

Each entry in the vector corresponds to a difference at one specific time point between the expected value of the signal and the predicted value. This vector can be broken apart, and every element of every error vector in the testing data can be added to an error set as a single scalar number.

The score of the error set depends on the desired bit-resolution, B, of the machine-learning-enabled ADC and the strictness of its performance. In some implementations, the threshold is such that the maximum absolute error contained in the error set is less than the bit resolution of the device.

$$\max(\operatorname{abs}(E)) < \tfrac{1}{2}^B.$$

In an implementation in which the errors are assumed to follow a Gaussian distribution, then the standard deviation of the error set can be calculated. Using the interval estimates of a Gaussian, an overall 1-bit accuracy of 99.95% can be assumed if three and a half standard deviations of the error set is less than the required bit resolution.

$$3.5 * \operatorname{std}(E) < \tfrac{1}{2}^B.$$

The number of standard deviations can be adjusted to conform the resulting device into suitable performance.

Overfitting occurs when a machine-learning model performs exceedingly well on training data, but fails to generalize and produces faulty results on new, untrained samples. One operation for preventing overfitting is to distinguish the sample points used during training from the samples used during testing.

Another operation is to train and test the network on new training data every iteration to prevent optimizing to a specific training set. An example is K-fold cross validation, which splits the data set into K sets, where K is a positive integer. One set is randomly held out for testing each iteration, and the rest are used for training. The sample points in the data set also can be shuffled, such that the training set or test set are not all drawn from one time period, from one test device, or from one environmental condition (unless otherwise noted).

Finally, using a large data set helps prevent the machine-learning model from overfitting to the nature of a single sample point.

Edge cases can include analog signals near a saturation level of the device, analog signals at specific carrier frequencies, or a known specific pattern. These edge cases can be inspected by recording the performance of the array (either through simulation or on test devices) and matching that performance with the case's expected digital representation. The data generated from the edge cases can be separated from the randomized data used during training and testing procedure to not bias the results towards the edge cases. During testing, the edge case samples can be fed into the machine-learning model and errors can be determined. The errors are then scored separately for each edge case and are not included in the overall error set.

This scoring process results in a set of scoring metrics corresponding to whether the error produced in each evaluation condition is less than some threshold. For example, there could be an evaluation condition looking at the overall test error, and a different evaluation condition looking at the error in each edge case. The threshold for scoring the edge cases can differ from the threshold for the overall error set, allowing for stricter performance of the machine-learning model under specific conditions.

The specific machine-learning model can fail to converge due to a poorly configured machine-learning model, poor data-slicing, and/or a poorly configured parallel array. In the case of a poorly configured machine learning model, some hyperparameters of a model are not optimized during training, such as the number of nodes in a neural network, the number of layers, and the activation function. In the case of poor data-slicing, the timing between measurement of the parallel array and the reconstruction window of the signal can be misaligned, or the number of array measurements might be insufficient. In the case of a poorly configured parallel array, there might be information about the analog input signal missed by the circuit elements in the array. This missing information can result from a bad configuration of the circuit elements and/or improper resolution settings. To debug these issues, these aspects of the failing device can be adjusted, and the calibration process reperformed.

In general, the machine-learning unit maps measurement(s) from the parallel array to reconstruct a window of the expected digital signal. In many implementations, the timing of these measurements in relation to the reconstruction window can be critical for the performance of the device. For a given reconstruction window, a single array measurement might be sufficient, or multiple measures might be used. Those measurements can occur before or after the reconstruction window, with some offset lag. Additionally, the size of the reconstruction window might not be known. These relationships can influence the data buffer size, the latency of the system, and the sample rate of the array.

The initial data slicing can begin with multiple measurements of the parallel array, and the reconstruction window centered between these measurements (e.g., fewer than 5 measurements in either direction). If this slicing proves successful, the number of measurements is reduced until failure in many implementations. This reduction might result in the measurements being biased in one direction of time, such as more measurements prior to the reconstruction window or more after the reconstruction window. Once the minimal number of measurements is identified, the alignment of the reconstruction window can be shifted forward and backward in time, and the training procedure performed at each step. Once the optimal alignment is identified, the size of the reconstruction window can be expanded. If a larger reconstruction window size is successful, then there is a chance that the parallel array can be sampled at a slower rate. The entire calibration phase can then be repeated with the data collection phase tuned to the slower sample rate.

The parallel array includes circuit elements that each measure a feature of the analog input signal. These circuit elements are differentiated by, for example, the center frequency of a bandpass filter or the target frequency of a spectral sampling circuit. If a particular array fails to generate a feature set that can be successfully used by the machine-learning model, then additional circuit elements can be added. In such a case, the array can be reconfigured, such as uniformly spacing an increasing number of bandpass filters. Additional elements from a different circuit design can be included, such as an element that takes an instantaneous time measurement or the root-mean squared value of the signal. Once a successful array has been identified, a dimensionality reduction can be performed to prune elements.

In general, each circuit element applies an analog transformation on the input signal and digitizes the results. The precision of each feature might be critical in the success of the overall device. Therefore, the optimization procedure can begin with the highest resolution possible. The samples generated by the data collection phase can then be collected once, and the bit-resolution used in training the machine learning unit can be degraded to simulate lower feature resolution. If the parallel array is successful at a specific resolution, the resolution of the features can be reduced, and the process repeated.

During the calibration procedure, the machine-learning unit can be used to reduce the size and complexity of the device. The first step in the reduction process is to identify any possible elements in the parallel array that provide unnecessary data. There are techniques, such as principal component analysis or sequential dropout testing, that can be applied to the results of the parallel array to determine the role of each element. If a specific element can be omitted without substantially degrading the performance of the overall device, that element can be removed to save footprint space or shut off to conserve power.

The size and complexity of the machine-learning unit can be restricted to reduce the power consumption and footprint size of the device. An example method of reducing the size and complexity of the machine-learning unit is auto-encoding.

Figure 6:
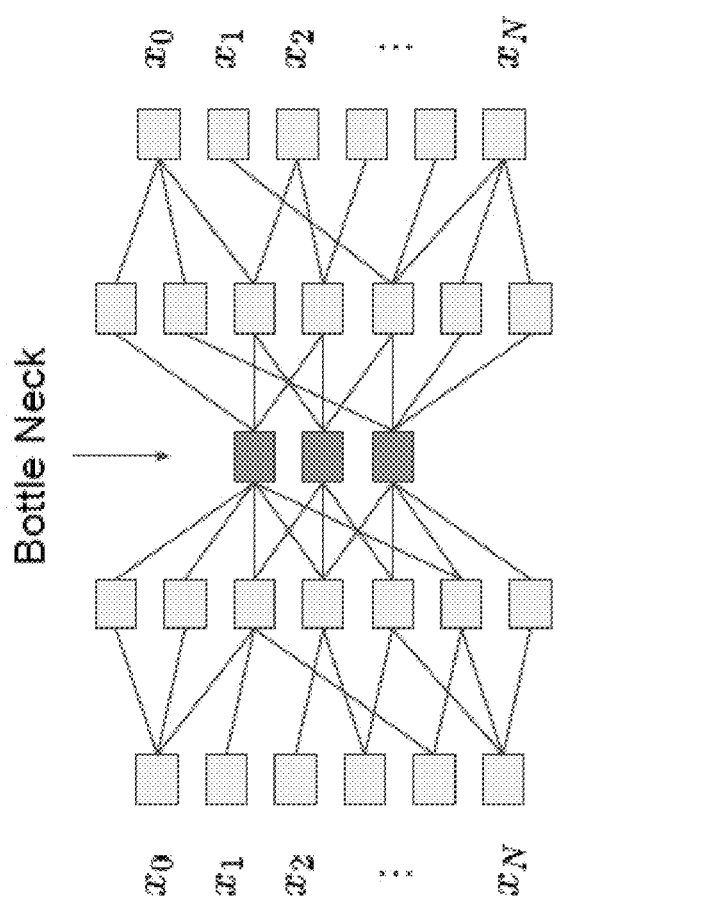
FIG. 6 shows an example diagram of an autoencoder, according to an implementation of the present disclosure.

As shown in FIG. 6, in this approach, a simplified neural network maps the results of the parallel array back onto itself. Specifically, FIG. 6 shows an example diagram of an autoencoder, according to an implementation of the present disclosure. A neural network is built to map the data collected from the parallel array back onto itself. To compress the data, the number of units in a middle bottleneck layer is restricted. If the restricted model works, then the data can be compressed. The layers after the bottleneck can be removed, and the machine-learning unit can be calibrated using the smaller bottleneck as the input layer.

That is, in this configuration, the input and output of the neural network both are the measurements from the parallel array. The number of nodes in an intermediate layer of the neural network are then reduced, and the network is recalibrated. This intermediate layer serves as a bottleneck that can reduce the dimensionality of the data. This node removal process is repeated until an efficient autoencoding format is found. Once the desired autoencoder network is identified, the layers of the network after the bottleneck can be discarded. The data at the bottleneck layer encodes the output of the parallel array in an efficient manner, and the machine-learning unit can be built using this bottleneck layer as input instead of the raw output of the parallel array. This autoencoding will ideally result in a compact solution, as the data from the parallel array is compressed through the bottleneck layer.

FIG. 4 illustrates a layout for an example implementation including a sensor input, according to various implementations of the present disclosure. The machine-learning unit 440 receives a sensor input 460 in addition to the split outputs of the analog input signal 410. The sensor input 460 can be received from external sensors to monitor performance of the device.

For example, consider an example case of a satellite traveling around the earth. While exposed to sunlight, the satellite is warm, and when out of direct light, the satellite is cold. As a result, the performance of the machine-learning-enabled ADC mounted on the satellite might differ in the two conditions. To compensate for the changing environment, the device can incorporate a temperature sensor as an additional input to the machine-learning unit. This temperature sensor can be incorporated into the wafer of the device or be connected externally. For example, these inputs could be a binary value, indicating whether a predetermined threshold is exceeded, a range, or a finely graded temperature reading. Accordingly, in the calibration phase, the learning process occurs at the various temperatures that the device might experience to incorporate the input from the temperature sensor.

ADC products include capacitors formed by placing two capacitive plates a precise distance apart. The distance between the two plates defines the capacitive value of a capacitor. If external forces are applied to a microchip containing the machine-learning-enabled ADC device, be it through faulty package installation or warping of a printed circuit board (PCB) on which the microchip is mounted, then the distances between the two plates in each capacitor might be altered. This distance alteration can distort the capacitive values of the overall system and degrade the calculation performance of the device. To account for this distortion, one or more strain gauges can be installed along one or more major axes of the ADC device, and their output can be incorporated as input to the ADC device's machine-learning model. Accordingly, in the calibration phase, the learning process occurs at the various forces that the ADC device might experience to incorporate the inputs from the strain sensor.

The machine-learning-enabled ADC device can be incorporated in or used near an MRI machine that applies strong magnetic fields. Capacitors are formed by placing charge on two metal plates, and a changing magnetic field can affect how charge builds up on these metal plates. This impact on the charge can distort the performance of the underlying capacitors and degrade the performance of the machine-learning-enabled ADC device.

Hall effect sensors can be installed on the device, and their output can be incorporated as input to the ADC device's machine-learning model. Accordingly, in the calibration phase, the learning process occurs at the various magnetic fields that the device might experience to incorporate the inputs from the Hall effect sensors.

Ionizing radiation striking a chip containing an ADC can cause electron displacement with unpredictable effect. In an environment that contains high levels of ionizing radiation, the addition of radiation sensors allows a machine-learning-enabled ADC to de-emphasize the readings produced by sampling subunits affected by ionizing radiation. Thus, the learning process can incorporate inputs from the radiation sensors.

To form a capacitor, an electrical insulator can be inserted between two metal plates to prevent charge from leaking across the gap. This insulator can be made of a dielectric material that has a specific permittivity value that defines how well the material prevents charge leakage. This permittivity value partially defines the capacitive value of the overall capacitor. Over time, the dielectric material will break down, altering its permittivity value. This alteration in the permittivity value can affect the capacitor value and, thus, degrade the ADC device's performance. This performance degradation can limit the ability to deploy the machine-learning-enabled ADC in a remote location and expect it to operate for years or decades.

This dielectric breakdown can be compensated for by monitoring the age of the device since manufacture. The manufacturing date can be hard coded onto the device and can be compared with the current date during operation. The current date can be supplied to the device either locally, with a battery-powered clock, or externally from circuitry outside the device. This "time since manufacture" value can then be incorporated as an input of an age sensor into the device's machine learning model. Accordingly, in the calibration phase, the learning process occurs at various simulated and/or experimentally tested time points that the device might experience to incorporate the inputs from the age sensor.

Using a constant and known DC voltage source as a benchmark, the ADC device can receive a sequence of measurements of an incoming analog input signal. If the supplied DC voltage to the ADC device significantly deviates or fluctuates from the expected DC voltage, the ADC elements might take faulty measurements, and the overall device performance will suffer. Thus, the DC voltage supplied to the device can be measured using an additional ADC subunit as a power-line sensor, and the result can be fed into the device's machine-learning model. Accordingly, in the calibration phase, the learning process occurs at various DC voltage levels that the device is expected to experience to incorporate inputs from the power-line sensor.

The ADC device samples the analog input signal at a fixed rate with a digital clock that oscillates at the frequency of the sample rate. However, a physically-realized digital clock can deviate from its ideal frequency, due to jitter. As a result, the timing of samples of the analog input signal might deviate according to this jitter. If this jitter is large enough, the overall system performance might degrade, since the measurements will no longer line up with the expected timing for the device. In select implementations, the clock jitter can be measured and fed into the ADC device's machine-learning model. For example, deterministic jitter can be compensated for by counting the clock cycles and feeding that into the input of the machine-learning unit. Predictable distortion then can be extracted from this clock count. Accordingly, in the calibration phase, the learning process occurs at various jitter offsets that the device might experience to incorporate inputs from the deterministic clock jitter sensor.

Further, the timing of the digital clock also can have random timing offsets due to thermal noise. Random jitter due to thermal noise can be measured, and the deviation of a single clock strike from the expected timing can be fed as input into the ADC device's machine-learning model. Accordingly, in the calibration phase, the learning process occurs at various jitter offsets that the device might experience to incorporate input from the thermal noise jitter sensor.

One example of such a sensor is to measure the decay of a discharging capacitor. If the capacitor discharges at a fixed rate, then measuring the instantaneous value of the capacitor at the clock strike can inform the precise timing of the clock strike.

Another approach is to leverage the Gaussian nature of the thermal noise. If multiple clocks are operated, then their average clock strike time can cancel out the thermal noise. This pooled clock can then serve as a benchmark to judge the mistiming of the clock strike.

The external environment can be expected to have a local effect, such that nearby resistors and capacitors might experience similar distortions. Thus, the machine-learning-enabled ADC device can be populated with (potentially additional) resistors and capacitors of different sizes and orientations, each connected to a measurement unit. These measurement units can monitor the resistance and capacitive values of these components through techniques like a Wheatstone bridge, Wein Bridge, etc). Changes in these measurements might correlate to changes in the performance of nearby elements. Thus, these resistor and capacitor sensors can produce an input fed into the ADC device's machine-learning model. In the calibration phase, the learning process occurs for the various environmental factors that the device might experience (through a multiphysics simulator or an experimental test rig) to incorporate inputs from the resistor and capacitor sensors.

The machine-learning-enabled ADC rarely might produce incorrect results that can be identified using a process failure flag.

FIG. 7A shows an analytical approach to test if the machine-learning-enabled ADC produces the correct answers. In this case, separate analog circuitry (lower left) directly measures a specific aspect of the analog input signal (such as DC offset, RMS, etc) to produce an output, □. The output of the machine-learning unit is fed into a set of digital circuitry to estimate the same quantity, □. If the difference between □ and □ is above a certain threshold, a process failure flag is thrown.

FIG. 7B shows an implementation in which the quantity □ is instead an additional output of the machine-learning unit.

These errors can occur either as a result of change in the parallel array or a misconfiguration of the machine-learning unit.

A change in the performance of the parallel array can occur if the device is placed in an unexpected environment that significantly differs from the calibration assumptions, such as a very hot environment when calibrated for a very cold environment. A change in the performance of the parallel array can also result from variances in manufacturing. The machine-learning unit also might be optimized for a test chip that does not match the characteristics of the deployed devices due to slight differences in production. A misconfiguration of the machine-learning unit can also occur through faulty calibration, where improper validation testing can cause an overfitting of the machine-learning model. A misconfiguration of the machine-learning model can also occur if improper calibration signals are used. This improper use can happen if the machine-learning unit is trained on simplified calibration signals with radically different characteristics than the actual analog input.

In such a case, the machine-learning-enabled ADC might produce faulty measurements of the analog input signal. To identify this potential issue, the machine-learning-enabled ADC can throw a process failure flag. This fault-checking can use analog circuitry that measures well-characterized feature(s) of the input signal, such as the DC offset, the root-mean squared value, and every 'Nth' value. These fault-check features can be measured at timepoints slower than the sample rate of the machine-learning-enabled ADC, such that the process failure is checked every Nth sample. This measurement allows the independent set of analog circuitry for measuring the feature(s) to be built out of robust parts.

The measured feature(s) can then be compared to the output of the machine-learning model. This comparison can occur by predicting the fault check feature(s) through an analytical calculation. In this case, a set of predetermined digital mathematical operations are performed on the output of the machine-learning-enabled ADC to predict the measured feature(s). For example, the root-mean squared value of the digital outputs of the machine-learning unit can be calculated and then compared against the analog calculation of root-mean squared value of the analog signal.

If the machine-learning unit applies filters or feature extraction to the analog signal, the output of the machine-learning-enabled ADC might not be standard Shannon-Nyquist samples. In this case, the output of the machine-learning model can be reconfigured to also output the expected digital representation of the fault-check feature(s).

During operation, the measurement of the fault-check feature(s) can be compared against the predicted feature(s) from the ADC device. If the predicted feature(s) deviates from the measured feature(s) more than a predetermined tolerance, the process failure flag can be thrown.

An onboard calibration unit can be installed as circuitry that performs the optimization of the neural network, or this onboard calibration unit can also be implemented in software that is executed by an external processor.

Figure 8A:
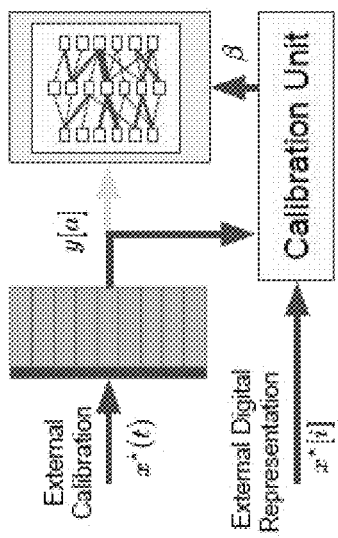
FIG. 8A shows the configuration of a calibration unit according to an implementation of the present disclosure.

FIG. 8A shows the configuration of a calibration unit according to an implementation of the present disclosure. The calibration unit generates a calibration analog signal. The machine-learning unit is disengaged from the parallel array. The results of the parallel array, □[□], are fed back into the calibration unit. After collecting the calibration signal, the calibration unit can optimize the machine-learning model, then upload the resulting model, β, to the machine-learning unit.

Figure 8C:
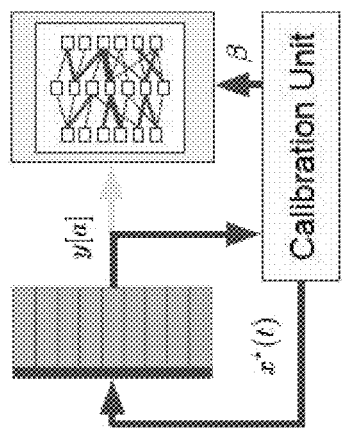
FIG. 8C shows a workflow with an externally-generated calibration signal using a 2-phase calibration signal.
Figure 8B:
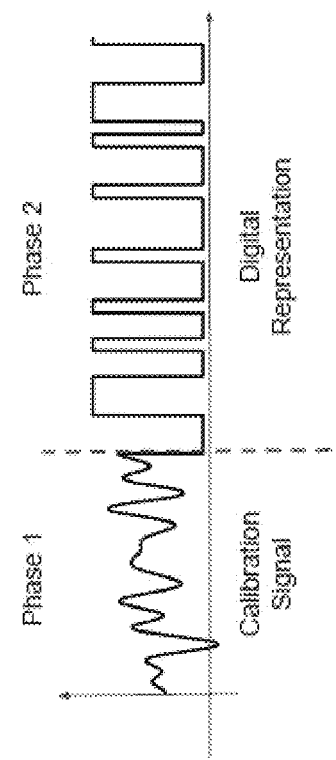
FIG. 8B shows a workflow in which the calibration signal is generated by an external source.

FIG. 8B shows a workflow in which the calibration signal is generated by an external source. In addition to the analog signal, the external source also provides the calibration unit the expected digital representation as a separate input.

Figure 8D:
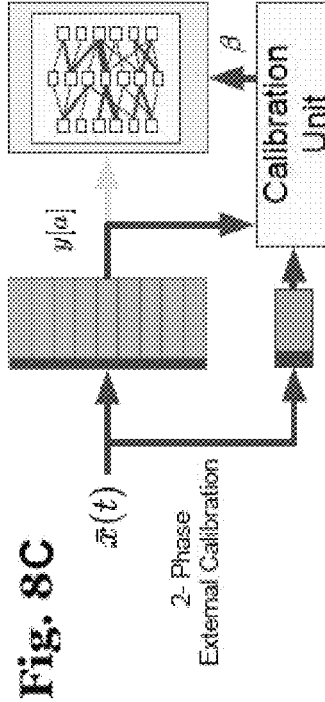
FIG. 8D shows an example of such a 2-phase calibration signal.

FIG. 8C shows a workflow with an externally-generated calibration signal using a 2-phase calibration signal. The calibration unit then has an external set of circuitry to listen to the calibration signal to record the digital representation. FIG. 8D shows an example of such a 2-phase calibration signal. The first phase is defined by the analog signal, and the second phase is defined by a digital representation of the analog signal in the first phase.

This onboard calibration can occur locally on the same wafer as the device, externally on a separate unit on the same PCB, or remotely on a distant resource. This calibration can occur as a one-off procedure, to refine the performance of a particular device, or as an ongoing process, to improve the long-term performance of the device. This process can occur in the factory prior to deployment and/or out in the field after deployment.

The calibration unit sends an analog input signal to the device and monitors the raw output of the parallel array. This process is performed across various environmental conditions the ADC device might experience to capture the behavior of the ADC device.

The analog input can originate from the calibration unit itself, deriving from a locally-stored digital calibration signal or generated from a local random number generator. In both cases, the calibration unit can include a digital-to-analog converter (DAC) to create the analog input signal from a digital format, which is then fed into the input of the machine-learning-enabled ADC.

The analog input signal can also originate externally from the calibration unit. In many implementations of this configuration, the calibration unit receives, from the external source, the expected digital representation of the analog input signal. This digital representation can be received as a separate input to the calibration unit. This additional input can be directly connected to the external source or transmitted through an intermediary, such as via WiFi to a microprocessor or microcontroller.

The digital representation additionally or alternatively can be patterned into the analog input. In this configuration, the analog input to the device can include two phases: the analog input signal and its digital representation. For example, the external source can stream the analog input signal to the ADC device, and then the external source can stream a slower version of the signal's digital representation. This slower version can encode the digital representation as a binary signal or through other signal modulation techniques. The calibration unit can listen for this transition and capture the slowed-down digital representation. This two-stage process then can be continuously repeated using a new analog input signal and its digital representations each time.

The calibration unit also can access the raw output of the parallel array of the ADC device. In various implementations, when the calibration process is activated, the machine-learning-enabled ADC temporarily can stop operating its machine-learning unit and begin to transmit the raw output of the parallel array. This transition can occur based on a calibration flag sent to the device. The raw output of the parallel array can be transmitted through the same channels that output the results of the machine-learning unit or through independent circuitry. The raw output can be fed directly into the calibration unit from the device or transmitted through an intermediary, such as via WiFi to a microprocessor or microcontroller.

In various implementations, the expected digital representation of the analog input signal can include standard Shannon Nyquist samples. The calibration unit can interpolate between those points to optimize a time delay between the production of the analog signal and the recording from the parallel array. The calibration unit can then apply filter or feature extraction to the expected digital samples. These filters or feature extractions can be provided remotely or stored locally in the calibration unit.

Once the raw output of the parallel array and its desired digital representation have been paired, the calibration unit can optimize the parameters of the machine-learning unit. This optimization process can differ from the optimization during manufacturing and can be customized for an application of the device, such as sacrificing resolution to conserve energy or vice-versa. Once the calibration unit has achieved a predetermined result, the optimized parameters can be installed onto the machine-learning unit of the ADC device. These parameters can be directly sent to the device from the calibration unit or through an intermediary, such as via WiFi to a microprocessor or microcontroller. Once the parameters are installed, the calibration unit can be deactivated. The machine-learning-enabled ADC can be notified by dropping the calibration process flag, and the device's machine-learning unit can be reengaged with the new parameters.

An onboard dimensionality reduction unit can apply similar dimensionality reduction techniques described in the calibration procedure, except that the dimensionality reduction device operates in situ.

Figure 9:
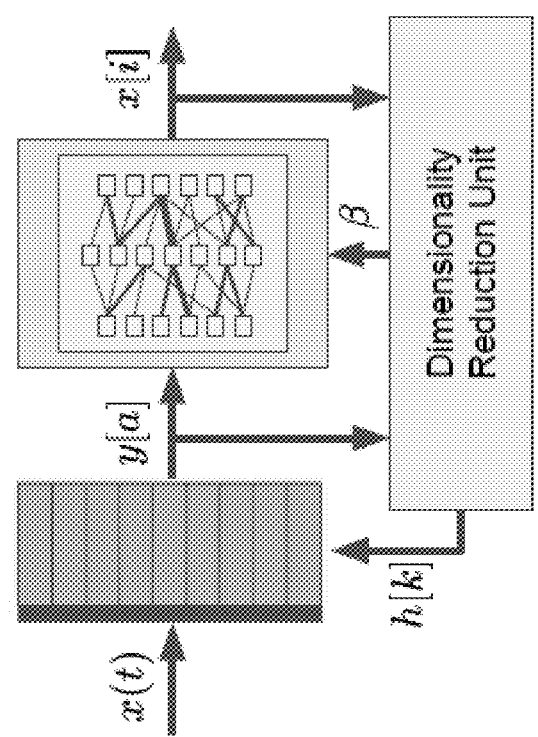
FIG. 9 shows a dimensionality reduction unit according to an implementation of the present disclosure.

FIG. 9 shows a dimensionality reduction unit according to an implementation of the present disclosure. The dimensionality reduction unit receives the output of the parallel array, □[□], and the output of the machine learning unit, □[□]. The machine learning unit is assumed to be correctly mapping □[□] to □[□]. The dimensionality reduction unit then looks for patterns in □[□]. If the dimensionality reduction unit deems features unnecessary, a control signal, □[□], is used to switch on or off specific elements in the parallel array to conserve power. If further patterns are found in the signal, the parameters of the model, β, are updated and uploaded to the machine-learning unit.

This unit can be installed as circuitry or implemented in software executed by an external processor. This onboard dimensionality reduction can occur locally on the same wafer as the device, externally on a separate unit on the same PCB, or remotely on a distant resource.

In general, this dimensionality reduction unit assumes the machine-learning-enabled ADC is correctly mapping the output of the parallel array to the digital representation. When a dimensionality reduction flag is thrown, the machine-learning-enabled ADC can begin transmitting the raw output of the parallel array in addition to the output of the machine-learning unit. In select implementations, this dimensionality reduction flag can be triggered by the dimensionality reduction unit itself. To trigger the dimensionality reduction flag, the unit can monitor the output of the machine-learning-enabled ADC and look for patterns, such as by using principal component analysis. If a significant pattern is found, the unit can throw the flag and engage the dimensionality reduction procedure.

When the dimensionality reduction procedure is engaged, the dimensionality reduction unit can monitor both the raw output of the parallel array and the corresponding output from the machine-learning unit. The raw output and corresponding output can be received directly from the machine-learning-enabled ADC or transmitted through an intermediary, such as via WiFi to a microprocessor or microcontroller. The dimensionality reduction unit can then apply the dimensionality reduction techniques described in the calibration procedure.

Principal component analysis can include the calculation of a covariance matrix. The unit can calculate the covariance matrix in a real-time manner. The covariance matrix first is initialized to zero, and for each sample, the dimensionality reduction unit can compute the covariance of that sample, and then add the covariance to the covariance matrix. The sample then can be discarded. The dimensionality reduction unit can continuously calculate eigenvalues of that covariance matrix after each sample, and the dimensionality reduction unit scores the critical dimensions of the input signal, based on the eigenvalues. This approach can save significantly on the local storage and compute time to implement the principle component analysis, which can differ from the approach implemented during manufacture.

During the dimensionality reduction procedure, the dimensionality reduction unit can simulate the performance of the machine-learning unit when excluding elements in the parallel array. The dimensionality reduction unit can create its own machine-learning model, similar to the machine-learning unit implemented on the ADC device, to map the reduced parallel array to the digital representation. The dimensionality reduction unit's machine-learning model can be trained on real data transmitted from the machine-learning-enabled ADC. The dimensionality reduction unit can also implement procedures to reduce the complexity of the machine-learning model, such as removing nodes and layers of a neural network. If the dimensionality reduction unit's simulations successfully map the analog input to its digital representation, then the dimensionality reduction unit can shutdown elements in the parallel array (e.g., to conserve energy) and/or update the hyperparameters of the machine-learning unit on the device.

Cases where there are strong temporal patterns in the input signal can merit dynamic dimensionality reduction. An input signal of long sequences of high frequency data followed by long sequences of low frequency data is an example of such a case. In the dynamic dimensionality reduction state, the dimensionality reduction unit powers elements in the array off and on, and the hyperparameters of the machine learning model are changed as needed between each sample of the device.

The onboard dimensionality reduction unit is to compensate for defects that occur during manufacturing. The parallel array can include additional elements, some percentage of which might fail. The dimensionality reduction unit can sort out an improved configuration for each specific device after manufacturing.

Figure 10:
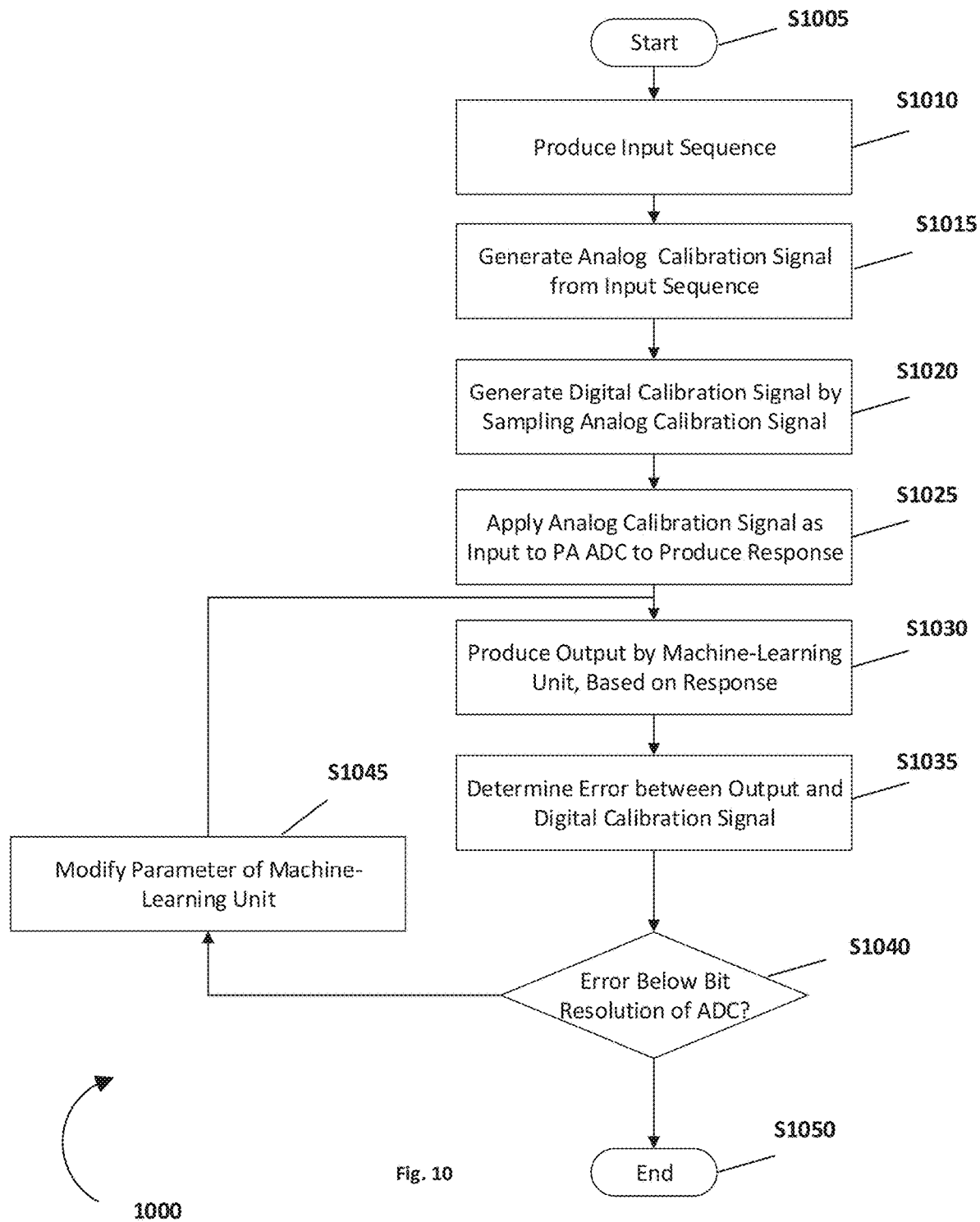
FIG. 10 illustrates an algorithm for calibration according to an implementation of the present disclosure.

FIG. 10 illustrates an algorithm 1000 for calibration according to an implementation of the present disclosure. The algorithm 1000 begins at S1005 and advances to S1010.

In S1010, an input sequence is produced. The input sequence can be, for example, random numbers or pseudo-random numbers. In select implementations, these numbers can be distributed parametrically across a range of values. In other implementations, the input sequence can be received from an electronic device or a physical condition or process that the machine-learning-enabled ADC is to experience. In select implementations, the input sequence can be generated by a generative adversarial network. The algorithm 1000 then advances to S1015.

In S1015, an analog calibration signal is generated from the input sequence. The analog calibration signal can be oversampled in various implementations. In select implementations, the analog calibration signal can be filtered. The algorithm 1000 then advances to S1020.

In S1020, a digital calibration signal is generated by sampling the analog calibration signal. In some implementations, the digital calibration signal is provided as an input to the machine-learning-enabled ADC. In other implementations, the digital calibration signal can be produced by subjecting the analog calibration signal to Nyquist-Shannon sampling. The digital calibration signal can also be produced by applying filtering, in particular implementations. The algorithm 10000 then advances to S1025.

In S1025, the analog calibration signal is applied as an input to the parallel array ADC to produce a response. The response is a digital signal that is stored for training. The algorithm 1000 then advances to S1030.

In S1030, the machine-learning unit produces an output, based on the response received from the parallel array ADC. For example, a neural network in the machine-learning unit applies weights or biases to the response to produce the output. The algorithm 1000 then advances to S1035.

In S1035, a processor determines an error between the output and digital calibration signal. The algorithm 1000 then advances to S1040.

In S1040, the processor determines whether the error determined in S1035 is less than a predetermined threshold. In some implementations, the predetermined threshold is the bit resolution of the machine-learning-enabled ADC. In other implementations, the predetermined threshold relates to a tolerance, such as a percentage of a full-range signal or a number of standard deviations. If the error is greater than the predetermined threshold, then the algorithm 1000 advances to S1045. If the error is less than the predetermined threshold, then the algorithm 1000 advances to S1050.

In S1045, a calibration unit can modify one or more of the parameters of the machine-learning unit. The parameters can be, for example, a weight or bias. The calibration unit calculates the gradient of the error with respect to each parameter. The calibration unit then applies a learning operation that adjusts each parameter in the direction of its gradient, to reduce the error. The algorithm 1000 then returns to S1030.

In S1050, the algorithm 1000 ends.

The algorithm 1000 is not limited to performance by the calibration unit of FIG. 8. In many implementations, the calibration unit of FIG. 8 can perform the algorithm 1000.

In one use case, this ADC device can be connected to an antenna to measure radio waves, such as RADAR signals, cellular communications, satellite communications, and Wi-Fi signals. In another use case, this ADC device can be connected to a microphone to measure sound waves produced through events such as human speech, music, seismic activity, ultrasounds, and sonar systems. In yet another use case, this ADC device can be connected to industrial sensors to measure information produced by strain gauges, thermometers, Hall effect sensors, and pressure gauges. In one more use case, this ADC device can be connected to analog voltage and current sources, such as electric motor speed controllers and charge controllers for battery systems. In an additional use case, this ADC device can be connected to a detector to detect visible light, x-rays, ionizing radiation, coherent light sources such as lasers, magnetic resonance, or particles. In still another case, this ADC device can be connected to a biological probe to measure electrocardiograms, electromyograms, or neural activity.

The unifying theme amongst all machine learning algorithms is prediction of a function's output for a given input, based on a dataset of training examples. An example of a machine learning algorithm well suited to use in the machine learning unit is a neural network because the machine learning unit can perform both function approximation and classification. However, alternative algorithms exist for both of these tasks.

Function approximation is the process by which the output of an unknown or hard to calculate function, the target function, can be matched within some known error range by a controlled function, the approximator function. The approximator function is then able to extrapolate, interpolate, or both, output values of the target function on input values for which true output values have not been observed or calculated. In the context of the present disclosure, the machine learning algorithm approximates the true mapping between the digital representations produced by the parallel array and the digital output codes that represent the value of the analog signal.

Equivalent function approximation results can be obtained by using other machine learning algorithms, such as support vector machines or kernel ridge regression. The particular method by which the machine learning algorithm approximates that mapping function depends on the algorithm.

Support Vector Machine

A support vector machine (SVM) is a machine learning algorithm for both classification and regression. In its standard implementation for regression, the SVM computes the linear function that optimally fits a dataset of examples. This optimal function is subject to a set of constraints, including: the slope of the linear function is minimized; and the errors (as calculated by, for example, the residuals, namely the observed values minus the predicted values) produced by the linear function on the dataset are within a desired tolerance. From this set of constraints and the training data, a Lagrangian function can be derived. This function represents the constraints of a linear function applied to the training data in a convex form. With this formulation, quadratic optimization techniques can minimize the Lagrangian to identify the optimal linear function that fits the dataset.

To perform nonlinear regression, a kernel trick is applied. The training data is projected into a higher dimensional space, using a non-linear mapping kernel function (such as a gaussian or polynomial). This kernel function can be chosen, such that the data in the higher dimensional space follow a linear relationship. The Lagrangian function can then be derived in the higher dimension and minimized using the same quadratic optimization technique as the linear case.

To perform the function approximation required by the machine learning unit, each set of digital representations produced by the parallel array can be treated as an N-dimensional vector, where N is the number of sampling elements. The input domain can be all permutations of parallel array measurements, and the output domain is the range of digital output codes produced by the machine-learning enabled ADC device.

An optimal regression function fitting the training dataset can be computed by performing the following operations. First, the N-dimensional vectors are remapped into a higher dimensional space with an appropriately chosen kernel function. Second, a Lagrangian function is derived to represent the cost function between the observed values and predicted values, subject to the constraints. Finally, the Lagrangian function can be minimized using quadratic optimization techniques. This process results in a nonlinear function approximating the true mapping between the digital representations and the output code.

Ridge Regression

A similar nonlinear optimization method is kernel ridge regression. Ridge regression is a method to solve the 'least-squares' problem when limited training data is available. The method attempts to fit a function to the data in a training set, while minimizing the complexity of the function.

$$f = \arg\min_f \Sigma_i^M (y_i - f(x_i))^2 + \lambda \|f\|^2.$$

Where M represents the training set, y represents the output of an example, x represents the input of an example, and $\lambda$ represents a smoothing factor to penalize the complexity of the function. The kernel ridge regression applies the same kernel trick as described for the SVM algorithm. This trick results in a regression function that is a weighted sum of the kernel function applied between the input point and every point in a training data set.

$$f(x) = \Sigma_i^M w_{(i)} K(x, x_i).$$

Plugging this regression function into the optimization problem reduces the problem into the following form:

$$w = \arg\min_w \|y - Kw\|[|^2]\_2 + \lambda w^T K w.$$

Where K is the kernel matrix such that $[\![ K\_ij ]\!]\_ = K(x\_i, x\_j)$. This function can be optimized by taking the derivative of the optimization problem with respect to the weights and setting it to zero. This results in a solution with the following form:

$$w = (\lambda I\_d + K K^T)^{(-1)} K Y.$$

This describes a method for computing the weights for the regression function. The kernel matrix represents the chosen kernel function applied to the inputs of examples in the training set, the Y matrix represents the outputs of the examples in the training set, and the lambda parameters represent the smoothing factor. This smoothing factor can be estimated empirically using a k-fold holdout method, where sections of the training set are reserved, and various smoothing factors are tested until the function accurately performs on the held out training data.

To perform the function approximation of the machine learning unit using kernel ridge regression, a training set of example measurements from the parallel array is collected. An appropriate kernel function is selected (such as a gaussian or polynomial). The kernel matrix can be calculated between every pair of examples in the training set. This kernel function can be used to calculate the weights of the regression function. These weights then can be optimized by adjusting the smoothing factor and testing the smoothed weights on a hold-out set. Once sufficient performance, as measured, for example, by the error between the actual and predicted values, has been achieved, training is stopped, and the regression function is then applied to new incoming measurements using the optimal weights.

Classification is the process of using patent, or explicitly visible, characteristics associated with some grouping of data in a dataset to infer some latent characteristic of that grouping. This can be thought of as applying a label to that grouping. For functions that have a finite range of output values, function approximation can be considered a subset of the classification task. In other words, a set of input values, when fed into the function, will result in one of the possible function output values. This is functionally equivalent to applying a label, or classification, to that grouping of input values, where the label is the function output value.

To take a concrete example, in the context of ADC output codes, there is a finite but very large number of outputs: an ADC that outputs a code 12 bits long would produce $2^{12}=4096$ possible output values. Any analog input value, of which there are infinitely many, will be mapped to one of those output code values. (The machine learning unit of a machine-learning enabled ADC will map the vast, but finite, number of permutations of digital representations to output code values.)

Therefore, any algorithm that can classify data can be sufficient to produce a function approximation for a function with a finite codomain, or range of possible output values. (General function approximators, capable of approximating functions with infinite codomains, remain useful where the actual extent of a finite range is not yet known.)

The classification process can also produce labels other than function output. The process can, for example, detect events or state changes in a time series of data. The label, represented as a flag value or control value in an output stream, can modify behavior of the device. Neural networks are well suited to classification tasks because they can accommodate an arbitrary number of output nodes. The same optimization techniques that cause a neural network to converge on one output dimension (for example, the approximated function output) can be adapted to train the network on an additional output dimension (for example, whether a state change happened or not).

Neural networks are a suitable algorithm to implement classification. Classification results can, however, be obtained by using other machine learning algorithms, such as K-nearest neighbor algorithms, Naive Bayes classifiers, or Hidden Markov models. The particular method by which the machine learning algorithm classifies data depends on the algorithm.

K-Nearest Neighbor

A simple classification algorithm that can be implemented by the machine learning unit is K-nearest neighbors. In this algorithm, a set of examples is collected and stored. Each example includes the digital representation produced by the parallel array of analog-to-digital converters and a label assigned to the example. For every new digital representation produced by the array, a distance metric (such as Euclidean distance) is computed between the new measurement and every example in the set. The examples in the training set are then ranked based on how far each example is from the new measurement. The K closest examples (where K is a user-defined constant) are identified, and a label is assigned to the new measurement based on the modal (i.e., the most frequently occurring) label assigned to the K nearest neighbors.

To perform the function approximation required by the machine learning unit using a K-nearest neighbor algorithm, each set of N digital representations in the training data set is matched with its corresponding ADC output code. The set of N digital representations is treated as an N-dimensional vector. An appropriate K is chosen empirically to minimize error on the particular training dataset. When the machine learning unit encounters a novel set of digital representations, it computes the distance of that novel N-dimensional vector from each other N-dimensional vector in the training set. The K nearest neighbors become the comparison group, and the most commonly occurring function value label of those neighbors is assigned to the novel set of digital representations.

The process for classification of other features in the signal is the same, but instead of the modal function value label being applied to the novel set of digital representations, the modal label of the appropriate characteristic, such as whether a state change has happened, is applied.

Naive Bayes

Another classification algorithm that can be implemented by the machine learning unit is Naive Bayes. This algorithm is a probabilistic classifier resulting from applying Bayes' theorem in the following form:

$$p(C\_i|X)=(p(C\_i) \cdot p(X|C\_i))/(p(X))$$

The theorem states that the probability that a specific measurement X has a specific label $C\_i$ is equal to the probability of that label occurring, $p(C\_i)$, times the probability that the specific label would generate that measurement, $p(X|C\_i)$, divided by the probability that the specific measurement occurs, $p(X)$. To simplify the calculations, and earn the "naive" descriptor, it can be assumed that each variable is conditionally independent, and that each predictor contributes equally to the overall prediction. The algorithm calculates the probability of each label being applied to the measurement, and then selects the label with the highest probability. This probability can be calculated for every possible label that can be applied to the measurement, and the most likely label can be assigned to the measurement.

To perform the function approximation of the machine learning unit using a Naive Bayes algorithm, a large dataset of examples is collected. Each example includes an N-dimensional vector containing the digital representations produced by the parallel array, and a label assigned to that vector. The probability of a given label $C\_i$ occurring, $p(C\_i)$, can be directly calculated by dividing the number of occurrences of that label by the total number of examples. For computational simplicity, the probability of a measurement occurring in any dimension is assumed to not depend on any measurement in any other dimension.

The probability of a specific measurement vector occurring, p(X), can be calculated by fitting a multivariate gaussian distribution to the training set of measurements. The number of dimensions of the multivariate gaussian will match the number of elements in the measurement vector, and takes the following form:

$$N(X,\mu,\Sigma) = (2\pi)^{-N/2} \cdot \det(\Sigma)^{-1/2} \cdot e^{-1/2(X-\mu)^T \Sigma^{-1}(X-\mu)}.$$

The value $\mu$ is an N-dimensional vector calculated by taking the mean across each dimension of the measurement vectors. The value $\Sigma$ is the covariance matrix that computes the covariance between each dimension in the measurement vectors, in the following form:

$$\Sigma = (X-\mu)(X-\mu)^T.$$

With these two quantities, $\mu$ and $\Sigma$, the probability that a new measurement vector would be drawn from the multivariate gaussian distribution, p(X), can be calculated.

Next, the probability, $p(X|C\_i)$, of the particular measurement vector occurring given a particular label $C\_i$ is calculated. This process can be the same as calculating the total probability of the measurement vector occurring, but fitting the multivariate gaussian to only the measurement vectors in the training set that have the particular label $C\_i$. This process results in a multivariate gaussian distribution specific to that label, $p(X|C\_i)$.

The three quantities $p(C\_i)$, $p(X)$, and $p(X|C\_i)$ have been found, and the probability $p(C\_i|X)$ of a label being correct, given a novel measurement vector, can now be calculated using Bayes' Theorem, above. The process is repeated for each possible label. The algorithm applies the label with the highest likelihood to the new measurement, thereby emulating function approximation.

Hidden Markov Models

The K-nearest neighbors and naive Bayes algorithms assume there is no temporal structure of the incoming signal. If there is a temporal structure in the signal, then a Hidden Markov Model can utilize that temporal structure to improve classification. Discussion of this algorithm will use the example of a heartbeat, although the principles extend to any other time-correlated signal, some of which are discussed above. In an electrocardiogram, a heartbeat produces a P-wave, followed by the QRS complex, followed by a T-wave. A Hidden Markov Model can utilize that expected signal sequence to determine the likelihood of certain states following other states.

In the context of performing function approximation, the state of interest to the algorithm would be the particular digital output code of the machine-learning enabled ADC. In the context of classifying examples, the state could instead indicate the presence or absence of a label. For example, in an electrocardiogram, the state could be "contains P wave" or "does not contain P wave".

The dataset for training the Hidden Markov Model requires sequences of measurement vectors. In the heartbeat example, the sequences can be recordings of multiple consecutive, uninterrupted heartbeats. The dataset contains sequential N-dimensional measurement vectors produced by the parallel array of analog-to-digital converters and a digital output code voltage label assigned to each vector. To establish the temporal order, each example in the dataset contains a link to the measurement vector immediately preceding and following it.

From this data set, four quantities are calculated for each state: the initial probability, the final probability, the transition probability, and the emission probability.

The initial probability is the likelihood of each state occurring first. In the function approximation context of the heartbeat example, this initial probability would indicate the likelihood of any voltage to be the one first recorded by the EKG. The final probability calculates the likelihood of each state occurring last. For example, this final probability would be the likelihood that any voltage is the final voltage to be recorded by the EKG. These probabilities are estimated by counting the occurrence of each voltage starting or stopping, respectively, the sequences in the dataset.

The transition probability indicates the likelihood that each state will be followed by each other state. For example, in an electrocardiogram, the negative voltage from a Q wave in the QRS complex is likely followed by a large positive voltage from the R wave. And the large positive voltage from the R wave is likely followed by a large negative voltage from the S wave. This transition probability can be calculated by counting the number of occurrences of each pair of states (for example, the previous voltage and the present voltage) and dividing by the total number of state transitions. Finally, the emission probability (similar to the naive Bayes method) is calculated by pooling together all the measurement vectors labeled with a specific state, and fitting a probability distribution (such as a multivariate Gaussian distribution) for each state.

With those four quantities calculated, the Viterbi algorithm can be implemented to predict the states for a sequence of measurement vectors from the parallel array of analog-to-digital converters. The algorithm begins by predicting the likelihood of each state being the one that starts the sequence. The algorithm then iterates to the next measurement in the sequence, and for every possible transition state, the algorithm calculates the most likely previous sequence of states that would result in that state occurring at that position in the sequence, as well as the likelihood that the transition state would arise given the measurement vector from the parallel array. This process is repeated for every step along the sequence of measurements, until the algorithm reaches the final measurement. At the end, the algorithm provides a likelihood for each state being applied as a label to the final measurement, as well as the most likely sequence of states for every measurement in the sequence that would result in that final voltage. The algorithm then identifies the state with the highest likelihood for the final measurement, and returns the most likely sequence of states that would cause that result.

In this way, the sequence of measurement vectors recorded from the parallel array is translated into standard voltage readings in function approximation. An identical process can be followed for other classification tasks, but instead of applying the function output value as a label, the other label is applied.

Figure 11:
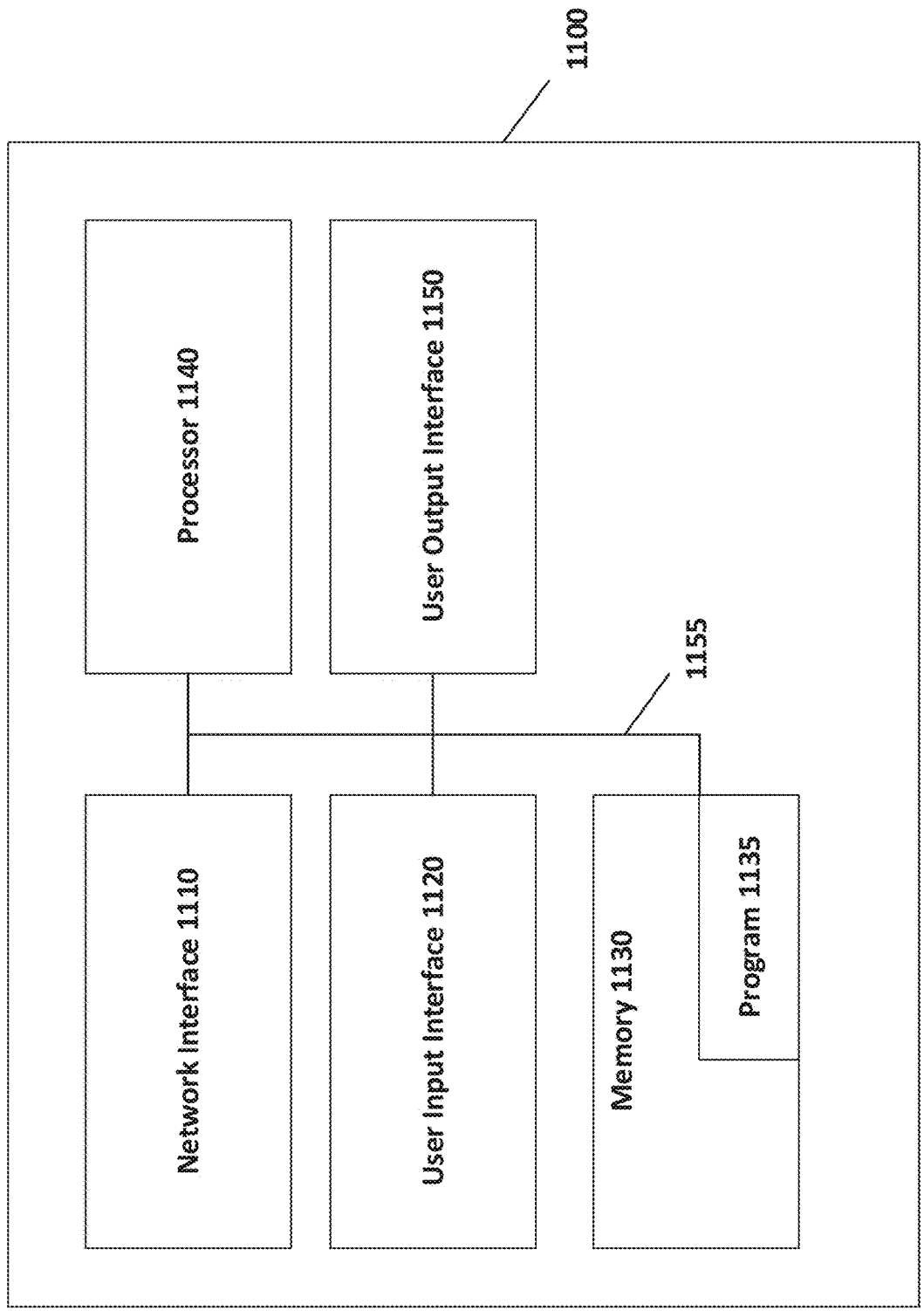
FIG. 11 illustrates a computing device, according to an implementation of the present disclosure.

FIG. 11 illustrates a computing device 1100, according to an implementation of the present disclosure. The machine learning unit 140 can be partially or entirely implemented by the computing device 1100.

The computing device 1100 can include a network interface 1110, a user input interface 1120, a memory 1130, a program 1135, a processor 1140, a user output interface 1150, and a bus 1155.

Although illustrated within a single housing, the computing device 1100 can be distributed across plural housings or sub-systems that cooperate in executing program instructions. In some implementations, the computing device 1100 can include one or more blade server devices, standalone server devices, personal computers (including laptop computers and tablet computers), routers, hubs, switches, bridges, firewall devices, intrusion detection devices, mainframe computers, network-attached storage devices, smartphones and other mobile telephones, and other computing devices. Although the system executes the Windows OS, macOS, or Linux in many implementations, the system hardware can be configured according to a Symmetric Multi-Processing (SMP) architecture or a Non-Uniform Memory Access (NUMA) architecture.

The network interface 1110 provides one or more communication connections and/or one or more devices that allow for communication between the computing device 1100 and other computing systems (not shown) over a communication network, collection of networks (not shown), or the air, to support the machine learning-enabled analog-to-digital converter, outlined herein. The network interface 1110 can communicate using various networks (including both internal and external networks), such as near-field communications (NFC), Wi-Fi™, Bluetooth, Ethernet, cellular (e.g., 3G, 4G, 5G), white space, 802.11x, satellite, Bluetooth, LTE, GSM/HSPA, CDMA/EVDO, DSRC, CAN, GPS, facsimile, or any other wired or wireless interface. Other interfaces can include physical ports (e.g., Ethernet, USB, HDMI, etc.), interfaces for wired and wireless internal subsystems, and the like. Similarly, nodes and user equipment (e.g., mobile devices) of the system can also include suitable interfaces for receiving, transmitting, and/or otherwise communicating data or information in a network environment.

The user input interface 1120 can receive one or more inputs from a human. The user input interface 1120 can be or include a mouse, a touchpad, a keyboard, a touchscreen, a trackball, a camera, a microphone, a joystick, a game controller, a scanner, or any other input device.

The memory 1130, also termed a "storage," can include or be one or more computer-readable storage media readable by the processor 1140 and that store software. The memory 1130 can be implemented as one storage device or across multiple co-located or distributed storage devices or subsystems. The memory 1130 can include additional elements, such as a controller, that communicate with the processor 1140. The memory 1130 can also include storage devices and/or sub-systems on which data and/or instructions are stored. The computing device 1100 can access one or more storage resources to access information to carry out any of the processes indicated in this disclosure and, in particular, FIG. 8. In various implementations, the memory 1130 stores the program 1135 to execute at least a portion of the algorithms illustrated in FIG. 8. Further, the program 1135, when executed by the computing device 1100 generally and/or the processor 1140 specifically, can direct, among other functions, performance of the operations of the machine learning-enabled analog-to-digital converter, as described herein.

The memory 1130 can be or include a read-only memory (ROM), a programmable ROM (PROM), an erasable PROM (EPROM), an electrically erasable PROM (EEPROM), a random-access memory (RAM), a dynamic RAM (DRAM), a static RAM (SRAM), a field programmable gate array (FPGA), a hard drive, a cache memory, a flash memory, a removable disk, or a tape reel. The memory 1130 can be or include resistive RAM (RRAM) or a magneto-resistive RAM (MRAM). The information being tracked, sent, received, or stored in a communication system can be provided in any database, register, table, cache, queue, control list, or storage structure, based on particular implementations, all of which could be referenced in any suitable timeframe.

The processor 1140 (e.g., a processing unit) can be or include one or more hardware processors and/or other circuitry that retrieve and execute software, especially the program 1130, from the memory 1130. The processor 1140 can be implemented within one processing device, chip, or package and can also be distributed across multiple processing devices, chips, packages, or sub-systems that cooperate. In some implementations, the processor 1140 is or includes a Graphics Processing Unit (GPU).

The processor 1140 can have any register size, such as a 32-bit register or a 64-bit register, among others. The processor 1140 can include multiple cores. Implementations of the processor 1140 are not limited to any particular number of threads. The processor 1140 can be fabricated by any process technology, such as 14 nm process technology.

The user output interface 1150 outputs information to a human user. The user output interface 1150 can be or include a display (e.g., a screen), a touchscreen, speakers, a printer, or a haptic feedback unit. In many implementations, the user output interface 1150 can be combined with the user input interface 1120. For example, some such implementations include a touchscreen, a headset including headphones and a microphone, or a joystick with haptic feedback.

In implementations including multiple computing devices, a server of the system or, in a serverless implementation, a peer can use one or more communications networks that facilitate communication among the computing devices to achieve the machine learning-enabled analog-to-digital converter, as outlined herein. For example, the one or more communications networks can include or be a local area network (LAN) or wide area network (WAN) that facilitate communication among the computing devices. One or more direct communication links can be included between the computing devices. In addition, in some cases, the computing devices can be installed at geographically distributed locations. In other cases, the multiple computing devices can be installed at one geographic location, such as a server farm or an office.

As used herein, the terms "storage media" or "computer-readable storage media" can refer to non-transitory storage media, such as non-limiting examples of a hard drive, a memory chip, an ASIC, and cache memory, and to transitory storage media, such as carrier waves or propagating signals.

Aspects of the system can be implemented in various manners, e.g., as a method, a system, a computer program product, or one or more computer-readable storage media). Accordingly, aspects of the present disclosure can take the form of a hardware implementation, a software implementation (including firmware, resident software, or microcode) or an implementation combining software and hardware aspects that can generally be referred to herein as a "module" or a "system." Functions described in this disclosure can be implemented as an algorithm executed by one or more hardware processing units, e.g., the processor 1140. In various embodiments, different operations and portions of the operations of the algorithms described can be performed by different processing units. Furthermore, aspects of the present disclosure can take the form of a computer program product embodied in one or more computer-readable media having computer-readable program code embodied, e.g., encoded or stored, thereon. In various implementations, such a computer program can, for example, be downloaded (or updated) to existing devices and systems or be stored upon manufacture of these devices and systems.

Any suitable permutation can be applied to a physical implementation, including the design of the communications network in which the system is implemented. In one embodiment, the bus 1155 can share hardware resources with the memory 1130 and the processor 1140. In this alternative implementation, the computing device 1100 can be provided with separate hardware resources including one or more processors and memory elements.

In example implementations, various other components of the computing device 1100 can be installed in different physical areas or can be installed as single units.

The communication system can be configured to facilitate communication with machine devices (e.g., vehicle sensors, instruments, electronic control units (ECUs), embedded devices, actuators, displays, etc.) through the bus 1155. Other suitable communication interfaces can also be provided for an Internet Protocol (IP) network, a user datagram protocol (UDP) network, or any other suitable protocol or communication architecture enabling network communication with machine devices.

The innovations in this detailed description can be implemented in a multitude of different ways, for example, as defined and covered by the claims and/or select examples. In the description, reference is made to the drawings where like reference numerals can indicate identical or functionally similar elements. Elements illustrated in the drawings are not necessarily drawn to scale. Additionally, certain implementations can include more elements than illustrated in a drawing and/or a subset of the elements illustrated in a drawing. Further, some implementations can incorporate a suitable combination of features from two or more drawings.

The disclosure describes various illustrative implementations and examples for implementing the features and functionality of the present disclosure. The components, arrangements, and/or features are described in connection with various implementations and are merely examples to simplify the present disclosure and are not intended to be limiting. In the development of actual implementations, implementation-specific decisions can be made to achieve specific goals, including compliance with system, business, and/or legal constraints, which can vary from one implementation to another. Additionally, while such a development effort might be complex and time-consuming, it would be a routine undertaking for those of ordinary skill in the art having the benefit of this disclosure.

The systems, methods and devices of this disclosure have several innovative aspects, no one of which is solely responsible for the attributes disclosed herein. Some objects or advantages might not be achieved by implementations described herein. Thus, for example, certain implementations can operate in a manner that achieves or optimizes one advantage or group of advantages as taught herein and not other objects or advantages as taught or suggested herein.

In one example implementation, electrical circuits of the drawings can be implemented on a board of an associated electronic device. The board can be a general circuit board that can hold various components of the internal electronic system of the electronic device and, further, provide connectors for other peripherals. More specifically, the board can provide the electrical connections by which other components of the system can communicate electrically. Any processors (inclusive of digital signal processors, microprocessors, supporting chipsets, etc.) and computer-readable, non-transitory memory elements can be coupled to the board based on configurations, processing demands, and computer designs. Other components such as external storage, additional sensors, controllers for audio/video display, and peripheral devices can be attached to the board as plug-in cards, via cables, or integrated into the board itself. In various implementations, the functionalities described herein can be implemented in emulation form as software or firmware running within one or more configurable (e.g., programmable) elements arranged in a structure that supports these functions. A non-transitory, computer-readable storage medium can include instructions to allow one or more processors to carry out the emulation.

In another example implementation, the electrical circuits of the drawings can be implemented as stand-alone modules (e.g., a device with associated components and circuitry configured to perform a specific application or function) or implemented as plug-in modules into application specific hardware of electronic devices. Implementations of the present disclosure can be readily included in a system-on-chip (SOC) package. An SOC represents an integrated circuit (IC) that integrates components of a computer or other electronic system into one chip. The SOC can contain digital, analog, mixed-signal, and often radio frequency functions on one chip substrate. Other implementations can include a multi-chip-module (MCM), with a plurality of separate ICs located within one electronic package and that interact through the electronic package. In various other implementations, the processors can be implemented in one or more silicon cores in Application Specific Integrated Circuits (ASICs), Field Programmable Gate Arrays (FPGAs), programmable array logic (PAL), generic array logic (GAL), and other semiconductor chips.

The specifications, dimensions, and relationships outlined herein (e.g., the number of processors and logic operations) have been offered for non-limiting purposes of example and teaching. For example, various modifications and changes can be made to arrangements of components. The description and drawings are, accordingly, to be regarded in an illustrative sense, not in a restrictive sense.

The numerous examples provided herein described interaction in terms of two, three, or more electrical components for purposes of clarity and example. The system can be consolidated in any manner. Along similar design alternatives, the illustrated components, modules, and elements of the drawings can be combined in various possible configurations within the scope of this disclosure. In certain cases, one or more of the functionalities of a given set of flows might be more clearly described by referencing a limited number of electrical elements. The electrical circuits of the drawings are readily scalable and can accommodate many components, as well as more complicated/sophisticated arrangements and configurations. Accordingly, the provided examples do not limit the scope or inhibit the teachings of the electrical circuits as potentially applied to a myriad of other architectures.

In this disclosure, references to various features (e.g., elements, structures, modules, components, steps, operations, characteristics, etc.) included in "one implementation," "example implementation," "an implementation," "another implementation," "some implementations," "various implementations," "other implementations," "alternative implementation," and the like are intended to mean that any such features can be included in one or more implementations of the present disclosure and might or might not necessarily be combined in the same implementations. Some operations can be deleted or omitted where appropriate, or these operations can be modified or changed considerably. In addition, the timing of these operations can be altered considerably. The preceding operational flows have been offered for purposes of example and discussion. Implementations described herein provide flexibility in that any suitable arrangements, chronologies, configurations, and timing mechanisms can be provided.

EXAMPLES

In Example AM1, a method for calibrating a machine-learning unit includes generating an analog calibration signal from an input sequence; generating a digital calibration signal by taking digital samples representing the value of the analog calibration signal at a predetermined sample rate; applying the analog calibration signal as an input to a physical parallel array analog-to-digital converter (PA ADC) to produce a digital response; producing an output by the machine-learning unit, at least in part based on the digital response; modifying a parameter of the machine-learning unit to reduce an error between the output and the digital calibration signal; and determining that the error is not less than a predetermined threshold.

Example AM2 is the method of Example AM1, further comprising: scaling the analog calibration signal or the digital calibration signal to a predetermined voltage range and frequency bandwidth of the PA ADC.

Example AM3 is the method of Example AM1 or AM2, further comprising: generating a sequence of random or pseudo-random numbers uniformly distributed across a range to produce the input sequence.

Example AM4 is the method of any of Examples AM1-AM3, further comprising: generating a sequence of random or pseudo-random numbers distributed parametrically across a range to produce the input sequence.

Example AM5 is the method of any of Examples AM1-AM4, further comprising: generating an analog signal by an electronic device or by a physical condition or process; and digitally sampling the analog signal to produce the input sequence, wherein the PA ADC is to observe the electronic device or the physical condition or process.

Example AM6 is the method of any of Examples AM1-AM5, further comprising: seeding a generative network of a generative adversarial network with random numbers to create synthetic signals; training a discriminator network of the generative adversarial network with the synthetic signals and digital samples; producing a synthetic dataset by the generative adversarial network to resemble the digital samples; and drawing samples from the synthetic dataset to produce the input sequence, wherein the PA ADC is to observe an electronic device or a physical condition or process that generates samples substantially similar to the digital samples.

Example AM7 is the method of any of Examples AM1-AM6, further comprising: multiplexing analog signals from a plurality of sources to produce the input sequence.

In Example AA1, an apparatus includes a signal generator that generates an analog calibration signal from an input sequence and that generates a digital calibration signal by taking digital samples representing the value of the analog calibration signal at a predetermined sample rate; a physical parallel array analog-to-digital converter (PA ADC) configured to receive the analog calibration signal as an input and to produce a digital response, at least in part based on the analog calibration signal; a machine-learning unit that receives the digital response and configured to produce an output, at least in part based on the digital response; and a processing unit configured to modify a parameter of the machine-learning unit to reduce an error between the output and the digital calibration signal and to determine that the error is not less than a predetermined threshold.

Example AA2 is the apparatus of Example AA1, further comprising: a signal generator that scales the analog calibration signal or the digital calibration signal to a predetermined voltage range and frequency bandwidth of the PA ADC.

Example AA3 is the apparatus of any of Examples AA1-AA2, further comprising: a number generator that generates a sequence of random or pseudo-random numbers uniformly distributed across a range to produce the input sequence.

Example AA4 is the apparatus of any of Examples AA1-AA3, further comprising: a number generator that generates a sequence of random or pseudo-random numbers distributed parametrically across a range to produce the input sequence.

Example AA5 is the apparatus of any of Examples AA1-AA4, further comprising: an electronic device or sensor that generates an analog signal; and a sampler that digitally samples the analog signal to produce the input sequence, wherein the PA ADC receives a signal from the electronic device or the sensor.

Example AA6 is the apparatus of any of Examples AA1-AA5, further comprising: a generative adversarial network including a generative network and a discriminator network, the generative network seeded with random numbers to create synthetic signals, the discriminator network trained with the synthetic signals and digital samples, the generative adversarial network configured to produce a synthetic dataset to resemble the digital samples, wherein samples from the synthetic dataset are drawn to produce the input sequence, and the PA ADC receives a signal from an electronic device or a sensor that generates samples substantially similar to the digital samples.

Example AA7 is the apparatus of any of Examples AA1-AA6, further comprising: a multiplexer that multiplexes analog signals from a plurality of sources to produce the input sequence.

In Example AC1, a computer-readable medium includes instructions that, when executed by a processing unit, perform operations comprising: modifying a parameter of a machine-learning unit to reduce an error between an output and a digital calibration signal, wherein an analog calibration signal is generated from an input sequence, a digital calibration signal is generated by taking digital samples representing the value of the analog calibration signal at a predetermined sample rate, the analog calibration signal is applied as an input to a physical parallel array analog-to-digital converter (PA ADC) to produce a digital response, the machine-learning unit produces the output, at least in part based on the digital response; and determining that the error is not less than a predetermined threshold.

Example AC2 is the medium of Example AC1, wherein the analog calibration signal or the digital calibration signal is scaled to a predetermined voltage range and frequency bandwidth of the PA ADC.

Example AC3 is the medium of any of Examples AC1-AC2, wherein a sequence of random or pseudo-random numbers uniformly distributed across a range is generated to produce the input sequence.

Example AC4 is the medium of any of Examples AC1-AC3, wherein a sequence of random or pseudo-random numbers distributed parametrically across a range is generated to produce the input sequence.

Example AC5 is the medium of any of Examples AC1-AC4, wherein an analog signal is generated by an electronic device or by a physical condition or process, the analog signal is digitally sampled to produce the input sequence, and the PA ADC is to observe the electronic device or the physical condition or process.

Example AC6 is the medium of any of Examples AC1-AC5, wherein a generative network of a generative adversarial network is seeded with random numbers to create synthetic signals, a discriminator network of the generative adversarial network is trained with the synthetic signals and digital samples, a synthetic dataset is produced by the generative adversarial network to resemble the digital samples, samples from the synthetic dataset are drawn to produce the input sequence, and the PA ADC is to observe an electronic device or a physical condition or process that generates samples substantially similar to the digital samples.

Example AC7 is the medium of any of Examples AC1-AC6, wherein analog signals from a plurality of sources are multiplexed to produce the input sequence.

In Example AF1, an apparatus includes signal-generation means for generating an analog calibration signal from an input sequence and for generating a digital calibration signal by taking digital samples representing the value of the analog calibration signal at a predetermined sample rate; conversion means for converting the analog calibration signal to produce a digital response; output-production means for receiving the digital response and for producing an output, at least in part based on the digital response; and modification means for modifying a parameter of the output-production means to reduce an error between the output and the digital calibration signal and for determining that the error is not less than a predetermined threshold.

Example AF2 is the apparatus of Example AF1, further comprising: scaling means for scaling the analog calibration signal or the digital calibration signal to a predetermined voltage range and frequency bandwidth of the conversion means.

Example AF3 is the apparatus of any of Examples AF1-AF2, further comprising: number-generation means for generating a sequence of random or pseudo-random numbers uniformly distributed across a range to produce the input sequence.

Example AF4 is the apparatus of any of Examples AF1-AF3, further comprising: number-generation means for generating a sequence of random or pseudo-random numbers distributed parametrically across a range to produce the input sequence.

Example AF5 is the apparatus of any of Examples AF1-AF4, further comprising: analog-signal-generation means for generating an analog signal; and sampling means for digitally sampling the analog signal to produce the input sequence, wherein the conversion means receives a signal from the analog-signal-generation means.

Example AF6 is the apparatus of any of Examples AF1-AF5, further comprising: synthetic-dataset-production means for producing a synthetic dataset to resemble digital samples, the synthetic-dataset-production means seeded with random numbers to create synthetic signals and trained with the synthetic signals and the digital samples, wherein samples from the synthetic dataset are drawn to produce the input sequence; analog-signal-generation means for generating an analog signal; and sampling means for digitally sampling the analog signal to produce the input sequence, wherein the sampling means samples an output from the analog-signal-generation means to produce samples substantially similar to the digital samples, and the conversion means receives a signal from the analog-signal-generation means.

Example AF7 is the apparatus of any of Examples AF1-AF6, further comprising: multiplexing means for multiplexing analog signals from a plurality of sources to produce the input sequence.

In Example BM1, a method for calibrating a machine-learning unit includes generating an analog calibration signal from an input sequence; generating a digital calibration signal by taking digital samples representing the value of the analog calibration signal at a predetermined sample rate; applying the analog calibration signal as an input to a virtual parallel array analog-to-digital converter (PA ADC); simulating the virtual PA ADC in a circuit simulator or by a synthetic function or dataset to produce a digital response, at least in part based on the analog calibration signal; producing an output by the machine-learning unit, at least in part based on the digital response; modifying a parameter of the machine-learning unit to reduce an error between the output and the digital calibration signal; and determining that the error is not less than a predetermined threshold.

Example BM2 is the method of Example BM1, further comprising: scaling the analog calibration signal to a predetermined voltage range and frequency bandwidth of the PA ADC.

Example BM3 is the method of any of Examples BM1-BM2, further comprising: generating a sequence of random or pseudo-random numbers uniformly distributed across a range to produce the input sequence.

Example BM4 is the method of any of Examples BM1-BM3, further comprising: generating a sequence of random or pseudo-random numbers distributed parametrically across a range to produce the input sequence.

Example BM5 is the method of any of Examples BM1-BM4, further comprising: generating an analog signal by an electronic device or by a physical condition or process; and digitally sampling the analog signal to produce the input sequence, wherein the PA ADC is to observe the electronic device or the physical condition or process.

Example BM6 is the method of any of Examples BM1-BM5, further comprising: seeding a generative network of a generative adversarial network with random numbers to create synthetic signals; training a discriminator network of the generative adversarial network with the synthetic signals and digital samples; producing a synthetic dataset by the generative adversarial network to resemble the digital samples; and drawing samples from the synthetic dataset to produce the input sequence, wherein the PA ADC is to observe an electronic device or a physical condition or process that generates samples substantially similar to the digital samples.

Example BM7 is the method of any of Examples BM1-BM6, further comprising: multiplexing analog signals from a plurality of sources to produce the input sequence.

In Example BC1, a computer-readable medium includes instructions that, when executed by a processing unit, perform operations comprising: simulating a virtual parallel array analog-to-digital converter (PA ADC) in a circuit simulator or by a synthetic function or dataset to produce a digital response, at least in part based on an analog calibration signal, wherein an analog calibration signal is generated from an input sequence, a digital calibration signal is generated by taking digital samples representing the value of the analog calibration signal at a predetermined sample rate, and the analog calibration signal is applied as an input to the PA ADC; producing an output by a machine-learning unit, at least in part based on the digital response; modifying a parameter of the machine-learning unit to reduce an error between the output and the digital calibration signal; and determining that the error is not less than a predetermined threshold.

Example BC2 is the medium of Example BC1, wherein the analog calibration signal is scaled to a predetermined voltage range and frequency bandwidth of the PA ADC.

Example BC3 is the medium of any of Examples BC1-BC2, wherein a sequence of random or pseudo-random numbers uniformly distributed across a range is generated to produce the input sequence.

Example BC4 is the medium of any of Examples BC1-BC3, a sequence of random or pseudo-random numbers distributed parametrically across a range is generated to produce the input sequence.

Example BC5 is the medium of any of Examples BC1-BC4, wherein an analog signal is generated by an electronic device or by a physical condition or process; the analog signal is digitally sampled to produce the input sequence, and the PA ADC is to observe the electronic device or the physical condition or process.

Example BC6 is the medium of any of Examples BC1-BC5, wherein a generative network of a generative adversarial network is seeded with random numbers to create synthetic signals, a discriminator network of the generative adversarial network is trained with the synthetic signals and digital samples, a synthetic dataset is produced by the generative adversarial network to resemble the digital samples, samples from the synthetic dataset are drawn to produce the input sequence, and the PA ADC is to observe an electronic device or a physical condition or process that generates samples substantially similar to the digital samples.

Example BC7 is the medium of any of Examples BC1-BC6, wherein analog signals from a plurality of sources are multiplexed to produce the input sequence.

In Example BA1, an apparatus includes a generation unit that generates an analog calibration signal from an input sequence and that generates a digital calibration signal by taking digital samples representing the value of the analog calibration signal at a predetermined sample rate; a virtual parallel array analog-to-digital converter (PA ADC) simulated in a circuit simulator or by a synthetic function or dataset to receive the analog calibration signal as an input and to produce a digital response, at least in part based on the analog calibration signal; a machine-learning unit that receives the digital response and configured to produce an output, at least in part based on the digital response; and a processing unit configured to modify a parameter of the machine-learning unit to reduce an error between the output and the digital calibration signal and to determine that the error is not less than a predetermined threshold.

Example BA2 is the apparatus of Example BA1, further comprising: a scaling unit that scales the analog calibration signal to a predetermined voltage range and frequency bandwidth of the PA ADC.

Example BA3 is the apparatus of any of Examples BA1-BA2, further comprising: a number generator that generates a sequence of random or pseudo-random numbers uniformly distributed across a range to produce the input sequence.

Example BA4 is the apparatus of any of Examples BA1-BA3, further comprising: a number generator that generates a sequence of random or pseudo-random numbers distributed parametrically across a range to produce the input sequence.

Example BA5 is the apparatus of any of Examples BA1-BA4, further comprising: an electronic device or sensor that generates an analog signal; and a sampler that digitally samples the analog signal to produce the input sequence, wherein the PA ADC receives a signal from the electronic device or the sensor.

Example BA6 is the apparatus of any of Examples BA1-BA5, further comprising: a generative adversarial network including a generative network and a discriminator network, the generative network seeded with random numbers to create synthetic signals, the discriminator network trained with the synthetic signals and digital samples, the generative adversarial network configured to produce a synthetic dataset to resemble the digital samples, wherein samples from the synthetic dataset are drawn to produce the input sequence, and the PA ADC receives a signal from an electronic device or a sensor that generates samples substantially similar to the digital samples.

Example BA7 is the apparatus of any of Examples BA1-BA6, further comprising: a multiplexer that multiplexes analog signals from a plurality of sources to produce the input sequence.

In Example BF1, an apparatus includes signal-generation means for generating an analog calibration signal from an input sequence and for generating a digital calibration signal by taking digital samples representing the value of the analog calibration signal at a predetermined sample rate; simulation means for simulating a virtual PA ADC to produce a digital response, at least in part based on the analog calibration signal; output-production means for receiving the digital response and for producing an output, at least in part based on the digital response; and modification means for modifying a parameter of the output-production means to reduce an error between the output and the digital calibration signal and for determining that the error is not less than a predetermined threshold.

Example BF2 is the apparatus of Example BF1, further comprising: scaling means for scaling the analog calibration signal to a predetermined voltage range and frequency bandwidth of the simulation means.

Example BF3 is the apparatus of any of Examples BF1-BF2, further comprising: number-generation means for generating a sequence of random or pseudo-random numbers uniformly distributed across a range to produce the input sequence.

Example BF4 is the apparatus of any of Examples BF1-BF3, further comprising: number-generation means for generating a sequence of random or pseudo-random numbers distributed parametrically across a range to produce the input sequence.

Example BF5 is the apparatus of any of Examples BF1-BF4, further comprising: analog-signal-generation means for generating an analog signal; and sampling means for digitally sampling the analog signal to produce the input sequence, wherein the simulation means receives a signal from the analog-signal-generation means.

Example BF6 is the apparatus of any of Examples BF1-BF5, further comprising: synthetic-dataset-production means for producing a synthetic dataset to resemble digital samples, the synthetic-dataset-production means seeded with random numbers to create synthetic signals and trained with the synthetic signals and the digital samples, wherein samples from the synthetic dataset are drawn to produce the input sequence; analog-signal-generation means for generating an analog signal; and sampling means for digitally sampling the analog signal to produce the input sequence, wherein the sampling means samples an output from the analog-signal-generation means to produce samples substantially similar to the digital samples, and the simulation means converts a signal from the analog-signal-generation means.

Example BF7 is the apparatus of any of Examples BF1-BF6, further comprising: multiplexing means for multiplexing analog signals from a plurality of sources to produce the input sequence.

In Example CM1, a method for calibrating a machine-learning unit includes generating an analog calibration signal from an input sequence; generating a digital calibration signal by taking digital samples representing the value of the analog calibration signal at a predetermined sample rate; applying the analog calibration signal as an input to a physical parallel array analog-to-digital converter (PA ADC) to produce a digital response; producing an output by the machine-learning unit, at least in part based on the digital response; modifying a parameter of the machine-learning unit to reduce an error between the output and the digital calibration signal; and determining that the error is not less than a predetermined threshold.

Example CM2 is the method of Example CM1, further comprising: measuring, with a sensor, a temperature, a strain, a magnetic field, radiation, a device age, power-line noise, or a clock jitter to produce a measurement; and processing the measurement with the machine-learning unit.

Example CM3 is the method of any of Examples CM1-CM2, further comprising: measuring a feature of the analog input signal with analog-to-digital circuitry, the feature defined by at least one of an RMS value, every Nth value, or DC offset; and estimating, with digital circuitry, the feature from the output of the machine-learning unit to produce an estimated result, wherein the feature and the estimated result are compared.

Example CM4 is the method of any of Examples CM1-CM3, further comprising: generating the analog calibration signal and the digital calibration signal locally on a device including the machine-learning unit.

Example CM5 is the method of any of Examples CM1-CM3, wherein the analog calibration signal and the digital calibration signal are generated externally from a device including the machine-learning unit, and the apparatus receives the digital calibration signal through a separate channel.

Example CM6 is the method of any of Examples CM1-CM3, further comprising: capturing the digital calibration signal from an analog input, wherein the analog calibration signal and the digital calibration signal are generated externally from an apparatus including the machine-learning unit.

Example CM7 is the method of any of Examples CM1-CM6, further comprising: activating or deactivating elements of the PA ADC, based at least in part on the output of the machine-learning unit, modifying a hyperparameter of the machine-learning unit, based at least in part on the output of the machine-learning model, or modifying the parameter, based at least in part on the output of the machine-learning unit.

Example CM8 is the method of Example CM7, further comprising: shutting down elements in the PA ADC.

In Example CA1, an apparatus includes a signal generator that generates an analog calibration signal from an input sequence and that generates a digital calibration signal by taking digital samples representing the value of the analog calibration signal at a predetermined sample rate; a physical parallel array analog-to-digital converter (PA ADC) configured to receive the analog calibration signal as an input and to produce a digital response, at least in part based on the analog calibration signal; a machine-learning unit that receives the digital response and configured to produce an output, at least in part based on the digital response; and a processing unit configured to modify a parameter of the machine-learning unit to reduce an error between the output and the digital calibration signal and to determine that the error is not less than a predetermined threshold.

Example CA2 is the apparatus of Example CA1, further comprising: a sensor that measures a temperature, a strain, a magnetic field, radiation, a device age, power-line noise, or a clock jitter to produce a measurement, wherein the machine learning unit receives and processes the measurement.

Example CA3 is the apparatus of any of Examples CA1-CA2, further comprising: analog-to-digital circuitry configured to measure a feature of the analog input signal, the feature defined by at least one of an RMS value, every Nth value, or DC offset; and digital circuitry configured to estimate the feature from the output of the machine-learning unit to produce an estimated result, wherein the feature and the estimated result are compared.

Example CA4 is the apparatus of any of Examples CA1-CA3, wherein the analog calibration signal and the digital calibration signal are generated locally on the apparatus.

Example CA5 is the apparatus of any of Examples CA1-CA3, wherein the analog calibration signal and the digital calibration signal are generated externally from the apparatus, and the apparatus receives the digital calibration signal through a separate channel.

Example CA6 is the apparatus of any of Examples CA1-CA3, further comprising: circuitry configured to capture the digital calibration signal from an analog input, wherein the analog calibration signal and the digital calibration signal are generated externally from the apparatus.

Example CA7 is the apparatus of any of Examples CA1-CA6, further comprising: an onboard dimensionality reduction and restoration unit configured to activate or deactivate elements of the PA ADC, based at least in part on the output of the machine-learning unit, modify a hyperparameter of the machine-learning unit, based at least in part on the output of the machine-learning model, or modify the parameter, based at least in part on the output of the machine-learning unit.

Example CA8 is the apparatus of Example CA7, wherein the onboard dimensionality reduction unit shuts down elements in the PA ADC.

In Example CC1, a computer-readable medium includes instructions that, when executed by a processing unit, perform operations comprising: modifying a parameter of a machine-learning unit to reduce an error between an output and a digital calibration signal, wherein an analog calibration signal is generated from an input sequence, a digital calibration signal is generated by taking digital samples representing the value of the analog calibration signal at a predetermined sample rate, the analog calibration signal is applied as an input to a physical parallel array analog-to-digital converter (PA ADC) to produce a digital response, the machine-learning unit produces the output, at least in part based on the digital response; and determining that the error is not less than a predetermined threshold.

Example CC2 is the medium of Example CC1, the operations further comprising: processing a measurement with the machine-learning unit, wherein a temperature, a strain, a magnetic field, radiation, a device age, power-line noise, or a clock jitter is measured to produce the measurement.

Example CC3 is the medium of any of Examples CC1-CC2, wherein a feature of the analog input signal is measured, the feature defined by at least one of an RMS value, every Nth value, or DC offset, the feature from the output of the machine-learning unit is estimated to produce an estimated result, and the feature and the estimated result are compared.

Example CC4 is the medium of any of Examples CC1-CC3, wherein the analog calibration signal and the digital calibration signal are generated locally on a device including the machine-learning unit.

Example CC5 is the medium of any of Examples CC1-CC3, wherein the analog calibration signal and the digital calibration signal are generated externally from a device including the machine-learning unit, and an apparatus including the processing unit receives the digital calibration signal through a separate channel.

Example CC6 is the medium of any of Examples CC1-CC3, wherein the digital calibration signal is captured from an analog input, and the analog calibration signal and the digital calibration signal are generated externally from an apparatus including the machine-learning unit.

Example CC7 is the medium of any of Examples CC1-CC6, the operations further comprising: activating or deactivating elements of the PA ADC, based at least in part on the output of the machine-learning unit, modifying a hyperparameter of the machine-learning unit, based at least in part on the output of the machine-learning model, or modifying the parameter, based at least in part on the output of the machine-learning unit.

Example CC8 is the medium of Example CC7, the operations further comprising: shutting down elements in the PA ADC.

In Example CF1, an apparatus includes signal-generation means for generating an analog calibration signal from an input sequence and for generating a digital calibration signal by taking digital samples representing the value of the analog calibration signal at a predetermined sample rate; conversion means for converting the analog calibration signal to produce a digital response; output-production means for receiving the digital response and for producing an output, at least in part based on the digital response; and modification means for modifying a parameter of the output-production means to reduce an error between the output and the digital calibration signal and for determining that the error is not less than a predetermined threshold.

Example CF2 is the apparatus of Example CF1, further comprising: means for measuring a temperature, a strain, a magnetic field, radiation, a device age, power-line noise, or a clock jitter to produce a measurement, wherein the machine-learning unit processes the measurement.

Example CF3 is the apparatus of any of Examples CF1-CF2, further comprising: means for measuring a feature of the analog input signal, the feature defined by at least one of an RMS value, every Nth value, or DC offset; and means for estimating the feature from the output of the machine-learning unit to produce an estimated result, wherein the feature and the estimated result are compared.

Example CF4 is the apparatus of any of Examples CF1-CF3, further comprising: means for generating the analog calibration signal and the digital calibration signal locally on the apparatus.

Example CF5 is the apparatus of any of Examples CF1-CF3, wherein the analog calibration signal and the digital calibration signal are generated externally from the apparatus, and the apparatus receives the digital calibration signal through a separate channel.

Example CF6 is the apparatus of any of Examples CF1-CF3, further comprising: means for capturing the digital calibration signal from an analog input, wherein the analog calibration signal and the digital calibration signal are generated externally from the apparatus.

Example CF7 is the apparatus of any of Examples CF1-CF6, further comprising: dimensionality-reduction-and-restoration means for activating or deactivating elements of the PA ADC, based at least in part on the output of the machine-learning unit, modifying a hyperparameter of the machine-learning unit, based at least in part on the output of the machine-learning model, or modifying the parameter, based at least in part on the output of the machine-learning unit.

Example CF8 is the apparatus of Example CF7, wherein the dimensionality-reduction-and-restoration means shut down elements in the PA ADC.

I claim:

1. A method for calibrating a machine-learning unit, the method comprising:
generating an analog calibration signal from an input sequence;
generating a digital calibration signal by taking digital samples representing the value of the analog calibration signal at a predetermined sample rate;
applying the analog calibration signal as an input to a physical parallel array analog-to-digital converter (PA ADC) to produce a digital response;
producing an output by the machine-learning unit, at least in part based on the digital response;

modifying a parameter of the machine-learning unit to reduce an error between the output and the digital calibration signal; and determining that the error is not less than a predetermined threshold.

2. The method of claim 1, further comprising:

scaling the analog calibration signal or the digital calibration signal to a predetermined voltage range and frequency bandwidth of the PA ADC.

3. The method of claim 1, further comprising:

generating a sequence of random or pseudo-random numbers uniformly distributed across a range to produce the input sequence.

4. The method of claim 1, further comprising:

generating a sequence of random or pseudo-random numbers distributed parametrically across a range to produce the input sequence.

5. The method of claim 1, further comprising:

generating an analog signal by an electronic device or by a physical condition or process; and digitally sampling the analog signal to produce the input sequence, wherein the PA ADC is to observe the electronic device or the physical condition or process.

6. The method of claim 1, further comprising:

seeding a generative network of a generative adversarial network with random numbers to create synthetic signals;

training a discriminator network of the generative adversarial network with the synthetic signals and digital samples;

producing a synthetic dataset by the generative adversarial network to resemble the digital samples; and drawing samples from the synthetic dataset to produce the input sequence, wherein the PA ADC is to observe an electronic device or a physical condition or process that generates samples substantially similar to the digital samples.

7. The method of claim 1, further comprising:

multiplexing analog signals from a plurality of sources to produce the input sequence.

8. An apparatus, comprising:

a signal generator that generates an analog calibration signal from an input sequence and that generates a digital calibration signal by taking digital samples representing the value of the analog calibration signal at a predetermined sample rate;

a physical parallel array analog-to-digital converter (PA ADC) configured to receive the analog calibration signal as an input and to produce a digital response, at least in part based on the analog calibration signal;

a machine-learning unit that receives the digital response and configured to produce an output, at least in part based on the digital response; and a processing unit configured to modify a parameter of the machine-learning unit to reduce an error between the output and the digital calibration signal and to determine that the error is not less than a predetermined threshold.

9. The apparatus of claim 8, further comprising:

a signal generator that scales the analog calibration signal or the digital calibration signal to a predetermined voltage range and frequency bandwidth of the PA ADC.

10. The apparatus of claim 8, further comprising:

a number generator that generates a sequence of random or pseudo-random numbers uniformly distributed across a range to produce the input sequence.

11. The apparatus of claim 8, further comprising:

a number generator that generates a sequence of random or pseudo-random numbers distributed parametrically across a range to produce the input sequence.

12. The apparatus of claim 8, further comprising:

an electronic device or sensor that generates an analog signal; and a sampler that digitally samples the analog signal to produce the input sequence, wherein the PA ADC receives a signal from the electronic device or the sensor.

13. The apparatus of claim 8, further comprising:

a generative adversarial network including a generative network and a discriminator network, the generative network seeded with random numbers to create synthetic signals, the discriminator network trained with the synthetic signals and digital samples, the generative adversarial network configured to produce a synthetic dataset to resemble the digital samples, wherein samples from the synthetic dataset are drawn to produce the input sequence, and the PA ADC receives a signal from an electronic device or a sensor that generates samples substantially similar to the digital samples.

14. The apparatus of claim 8, further comprising:

a multiplexer that multiplexes analog signals from a plurality of sources to produce the input sequence.

15. A computer-readable medium including instructions that, when executed by a processing unit, perform operations comprising:

modifying a parameter of a machine-learning unit to reduce an error between an output and a digital calibration signal, wherein an analog calibration signal is generated from an input sequence, a digital calibration signal is generated by taking digital samples representing the value of the analog calibration signal at a predetermined sample rate, the analog calibration signal is applied as an input to a physical parallel array analog-to-digital converter (PA ADC) to produce a digital response, the machine-learning unit produces the output, at least in part based on the digital response; and determining that the error is not less than a predetermined threshold.

16. The medium of claim 15, wherein the analog calibration signal or the digital calibration signal is scaled to a predetermined voltage range and frequency bandwidth of the PA ADC.

17. The medium of claim 15, wherein a sequence of random or pseudo-random numbers uniformly distributed across a range is generated to produce the input sequence.

18. The medium of claim 15, wherein a sequence of random or pseudo-random numbers distributed parametrically across a range is generated to produce the input sequence.

19. The medium of claim 15, wherein an analog signal is generated by an electronic device or by a physical condition or process, the analog signal is digitally sampled to produce the input sequence, and the PA ADC is to observe the electronic device or the physical condition or process.

20. The medium of claim 15, wherein a generative network of a generative adversarial network is seeded with random numbers to create synthetic signals, a discriminator network of the generative adversarial network is trained with the synthetic signals and digital samples, a synthetic dataset is produced by the generative adversarial network to resemble the digital samples, samples from the synthetic dataset are drawn to produce the input sequence, and the PA ADC is to observe an electronic device or a physical condition or process that generates samples substantially similar to the digital samples.

\* \* \* \* \*